US012648196B2

(12) United States Patent
Jespersen et al.

(10) Patent No.: US 12,648,196 B2
(45) Date of Patent: Jun. 2, 2026

(54) METHOD FOR MANUFACTURE OF NANOSTRUCTURE ELECTRICAL DEVICES

(71) Applicant: University of Copenhagen, Copenhagen K (DK)

(72) Inventors: Thomas Sand Jespersen, Virum (DK); Jesper Nygård, København Ø (DK); Damon Carrad, København N (DK); Martin Bjergfelt, Frederiksberg (DK)

(73) Assignee: University of Copenhagen, Copenhagen K (DK)

( * ) Notice: Subject to any disclaimer, the term of this patent is extended or adjusted under 35 U.S.C. 154(b) by 1325 days.

(21) Appl. No.: 17/258,202

(22) PCT Filed: Jul. 8, 2019

(86) PCT No.: PCT/EP2019/068197
§ 371 (c)(1),
(2) Date: Jan. 6, 2021

(87) PCT Pub. No.: WO2020/008076
PCT Pub. Date: Jan. 9, 2020

(65) Prior Publication Data
US 2022/0157932 A1      May 19, 2022

(30) Foreign Application Priority Data

Jul. 6, 2018     (EP) ..................................... 18182199

(51) Int. Cl.
*H10D 62/10*          (2025.01)
*H10N 60/01*          (2023.01)
*H10D 48/00*          (2025.01)

(52) U.S. Cl.
CPC ....... *H10D 62/123* (2025.01); *H10N 60/0604* (2023.02); *H10N 60/0632* (2023.02); *H10D 48/383* (2025.01); *H10N 60/0941* (2023.02)

(58) Field of Classification Search
CPC ......................... H10D 62/123; H10N 60/0632
See application file for complete search history.

(56) References Cited

U.S. PATENT DOCUMENTS

2004/0156108  A1      8/2004   Chou et al.
2011/0151190  A1      6/2011   Chung et al.
(Continued)

FOREIGN PATENT DOCUMENTS

JP          5243631          9/1993
WO          9000815          1/1990
(Continued)

OTHER PUBLICATIONS

Albrecht et al. "Exponential protection of zero modes in Majorana islands," Nature, vol. 531, pp. 206-223, Mar. 10, 2016.
(Continued)

*Primary Examiner* — Paul A Wartalowicz
(74) *Attorney, Agent, or Firm* — Merchant & Gould P.C.

(57)          ABSTRACT

The present disclosure further relates to nanostructures, in particular hybrid nanostructures with patterned growth of various layers for use in nanoscale electronic devices, such as hybrid semiconductor nanostructures with patterned growth and/or deposition of superconducting material for use in quantum devices. The presently disclosed method can be utilized for in-situ manufacturing of nanoscale electronic devices that have not been contaminated by ex-situ processes. One embodiment relates to a method for manufacturing a substrate for growth of crystalline nanostructures, the method comprising the steps of: depositing one or more layers of a crystal growth compatible dielectric material, such as silicon oxide, in a predefined pattern on the surface of a crystal growth compatible substrate to create a predefined etch pattern of said crystal growth compatible material, and selectively etching the substrate surface around said
(Continued)

etch pattern to provide at least one under-etched platform which is vertically raised from the etched substrate surface.

7 Claims, 17 Drawing Sheets

(56)                References Cited

U.S. PATENT DOCUMENTS

| | | | |
|---|---|---|---|
| 2013/0023121 A1 | 1/2013 | Yu et al. | |
| 2015/0054135 A1 | 2/2015 | Ho et al. | |
| 2017/0104061 A1* | 4/2017 | Peng | H01L 29/78696 |
| 2018/0130878 A1* | 5/2018 | Pawlak | H01L 29/78642 |

FOREIGN PATENT DOCUMENTS

| | | |
|---|---|---|
| WO | 2009029302 | 3/2009 |
| WO | 2016000836 | 1/2016 |
| WO | 2016001365 | 1/2016 |
| WO | 2016207415 | 12/2016 |
| WO | 2017023394 | 2/2017 |
| WO | 2017153388 | 9/2017 |

OTHER PUBLICATIONS

Chang et al. "Hard gap in epitaxial semiconductor-superconductor nanowires," Nature Nanotechnology, vol. 10, pp. 232-236, Mar. 2015.

Deng et al. "Majorana bound state in a coupled quantum-dot hybrid-nanowire system," Science, vol. 354, Issue 6319, pp. 1557-1562, Dec. 23, 2016.

Doll et al. "Micro-machined electron transparent alumina vacuum windows," Sensors and Actuators 87, pp. 52-59, Apr. 19, 2000.

Fülöp et al. "Wet etch methods for InAs nanowire patterning and self-aligned electrical contacts," arxiv.org, Cornell University Library, 201 Olin Library Cornell University Ithaca, NY 14853, pp. 1-9, 2016.

Gazibegovic et al. "Epitaxy of Nanowire Quantum Devices," Nature, vol. 548, pp. 434-448, Aug. 24, 2017.

Granata et al. Nano Superconducting Quantum Interference device: A powerful tool for nanoscale investigations, Physics Reports, vol. 614, pp. 1-69, 2015.

Gül et al. "Hard Superconducting Gap in InSb Nanowires," Nano Lett., vol. 17, pp. 2690-2696, 2017.

Larsen et al. "Semiconductor-Nanowire-Based Superconducting Qubit," Physical Review Letters, 115, pp. 127001-1-127001-5, Sep. 18, 2015.

Liu et al. "Observation of anomalous temperature dependence of the critical current in Pb/Sr2RuO4/Pb junctions," Physical Review B, vol. 59, No. 6, pp. 4433-4438, Feb. 1, 1999.

Lyuu Rong-Jhe et al. "Downscaling Metal-Oxide Thin-Film Transistors to Sub-50 nm in an Exquisite Film-Profile Engineering Approach," IEEE Transactions on Electron Devices, IEEE Service Center, Pisacataway, NJ, vol. 64, No. 3, pp. 1069-1075, Mar. 2017.

Mourik et al. "Signatures of Majorana Fermions in Hybrid Super-conductor-Semiconductor Nanowire Devices," Science, vol. 336, pp. 1003-1007 May 25, 2012.

Zhang et al. "Ballistic superconductivity in semiconductor nanowires," Nature Communications, pp. 1-7, Jul. 6, 2017.

European Patent Office; International Search Report and Written Opinion dated Oct. 22, 2019 for PCT Application No. PCT/EP2019/068197; 18 pps.

* cited by examiner

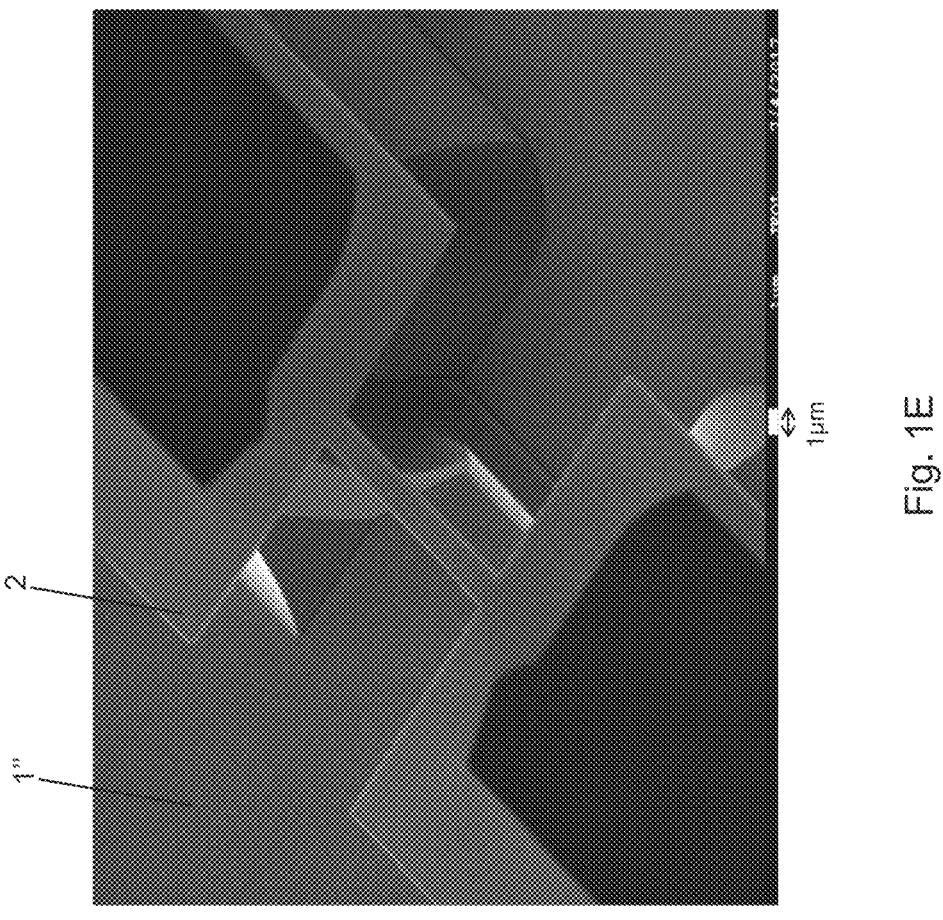
Fig. 1E
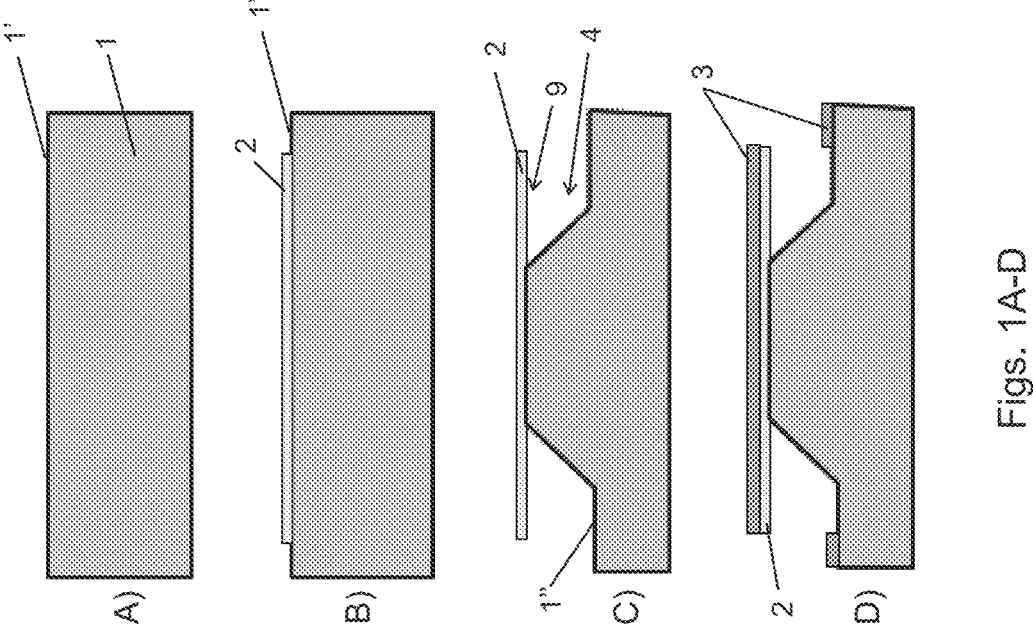
Figs. 1A-D

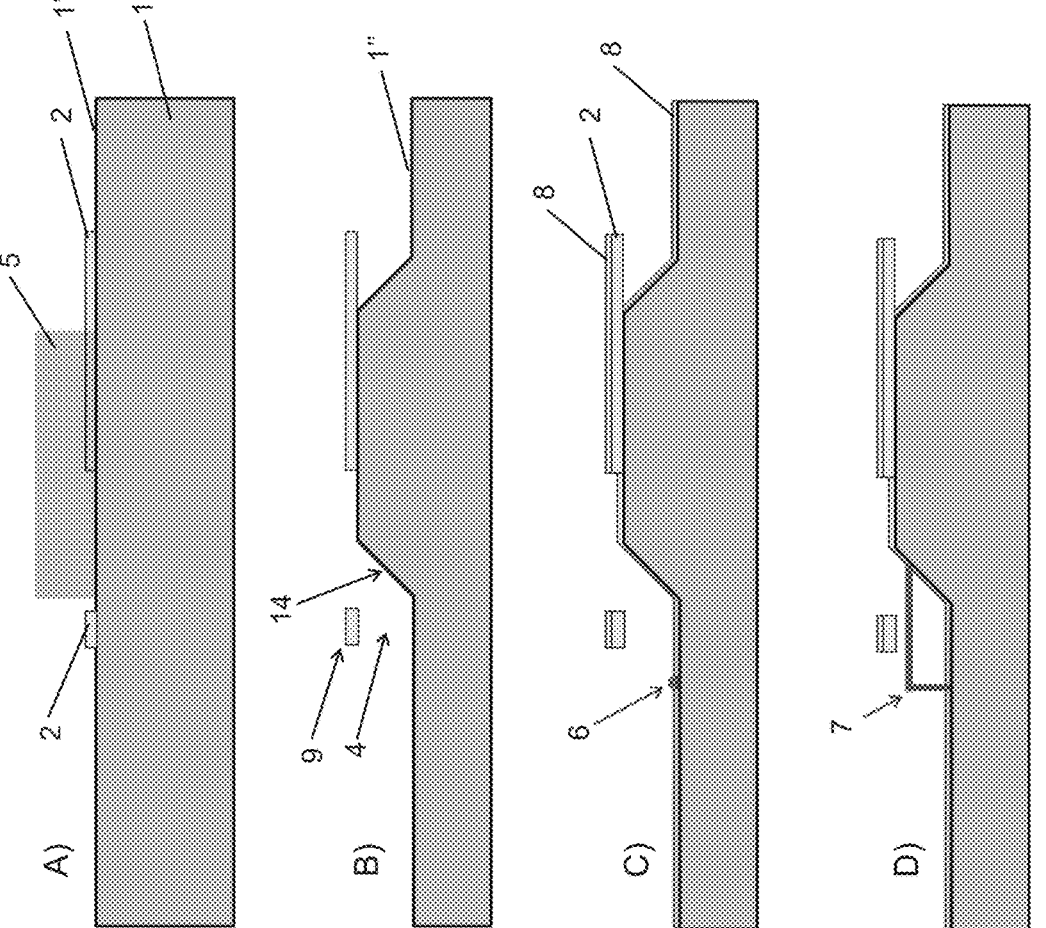
Figs. 3A-D

Figs. 4A-D

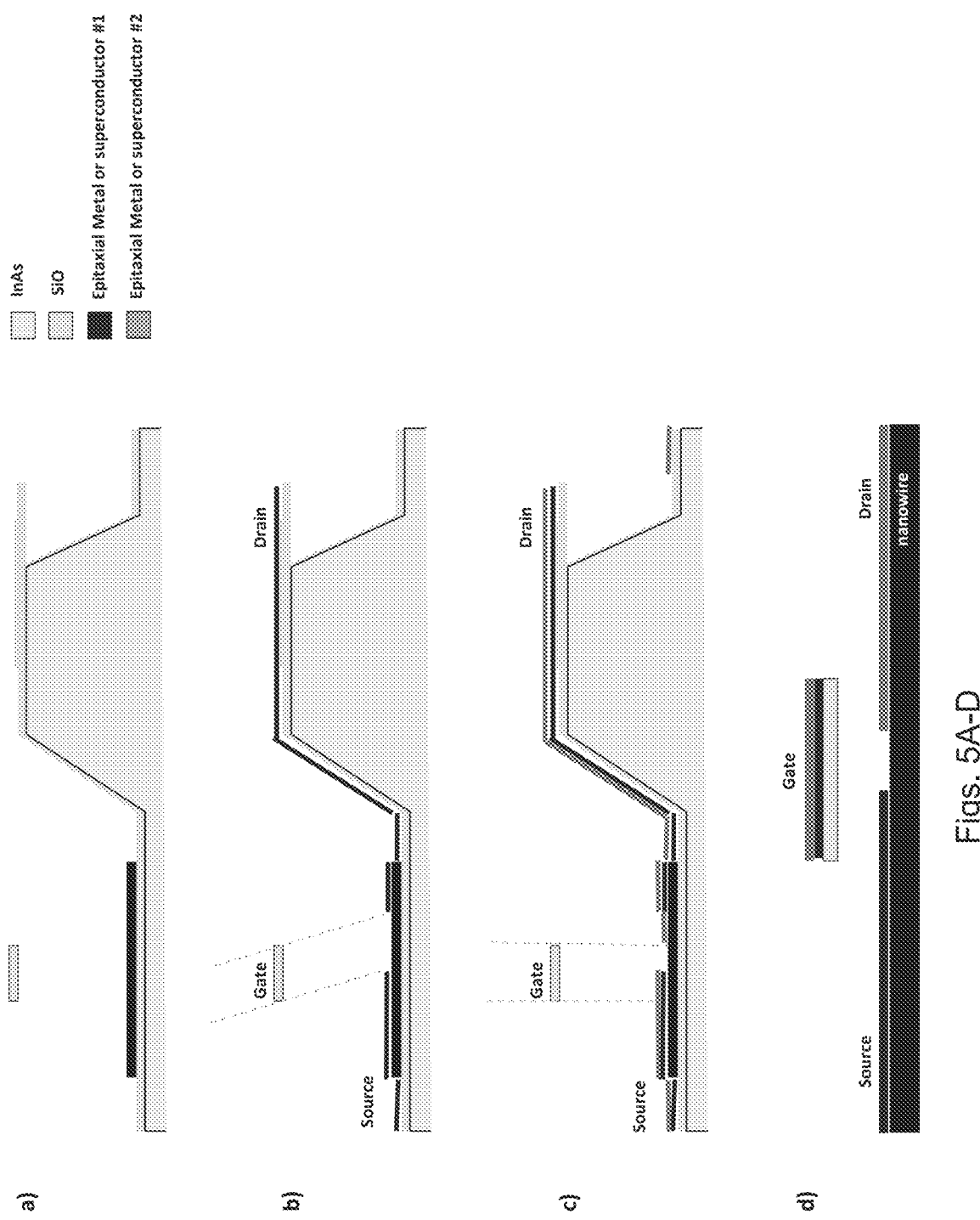
Figs. 5A-D

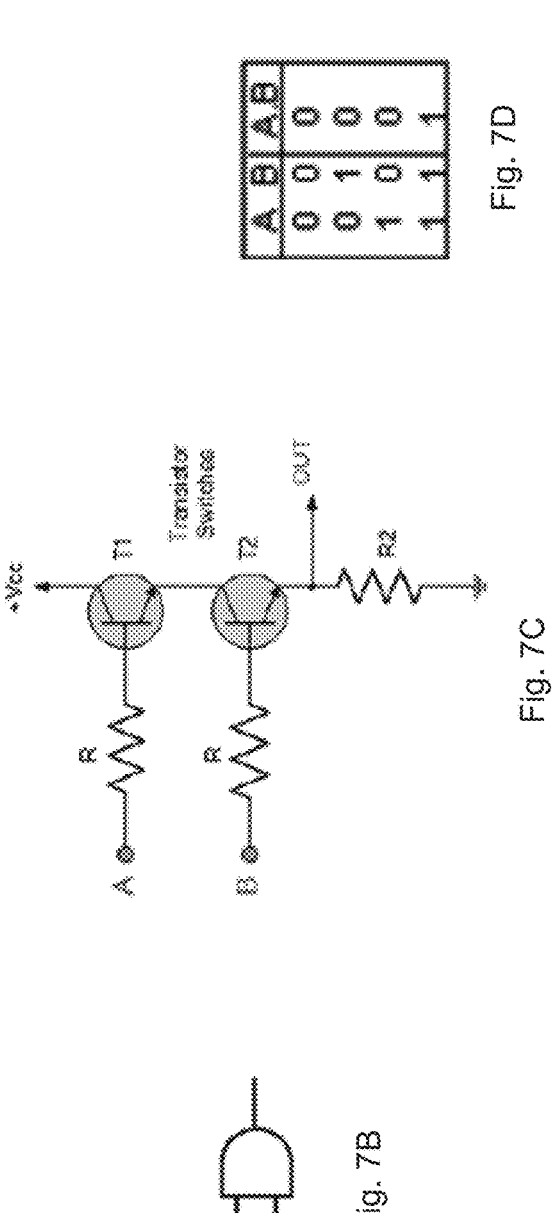
Fig. 7B
Fig. 7C
Fig. 7D
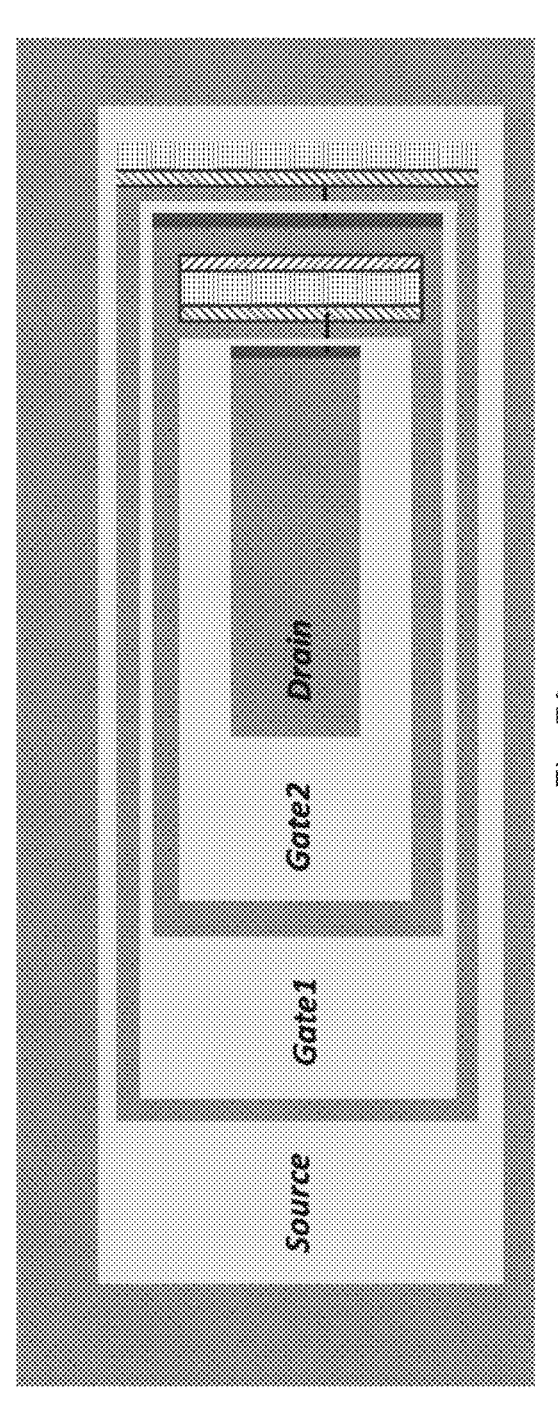
Fig. 7A

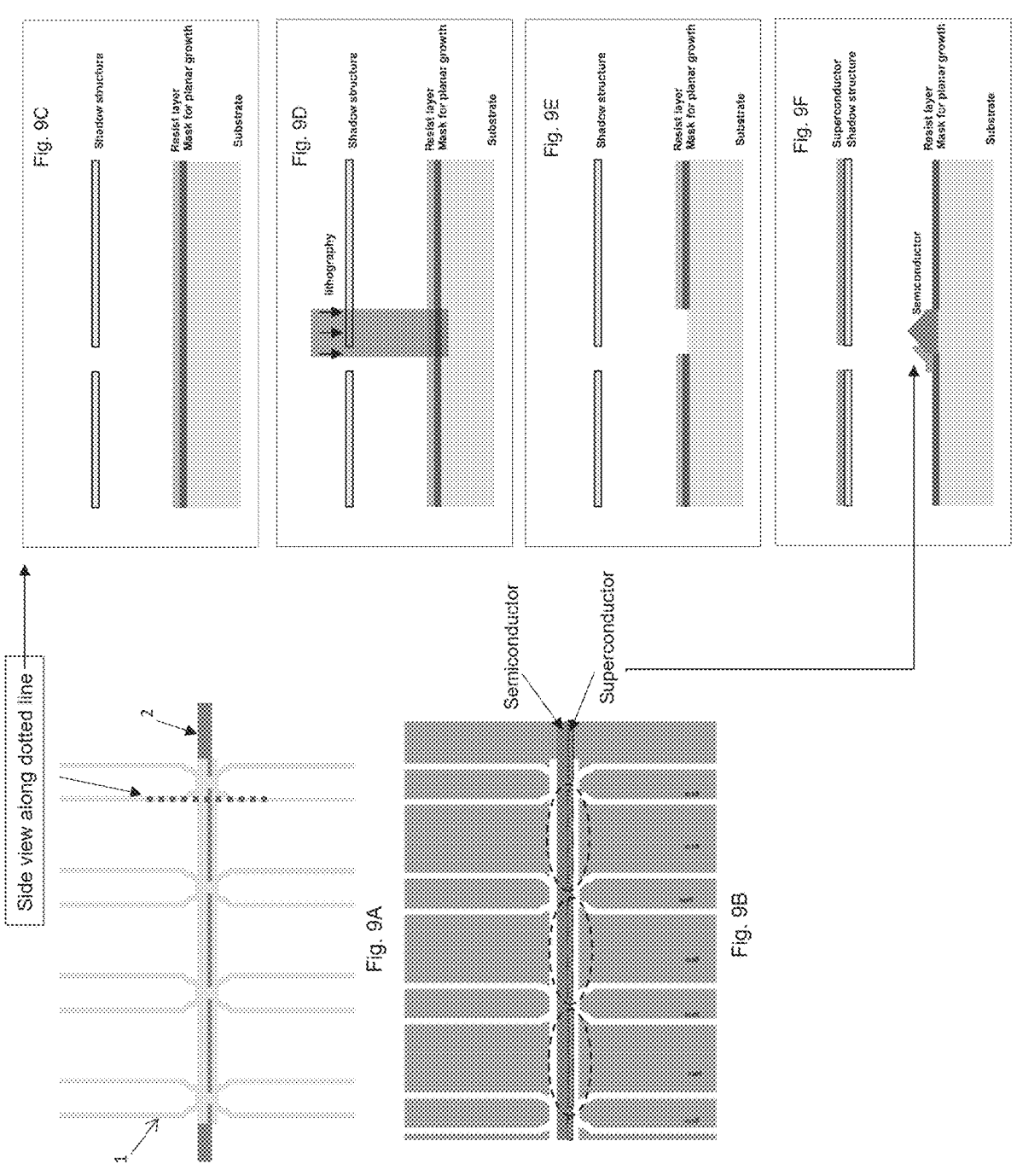

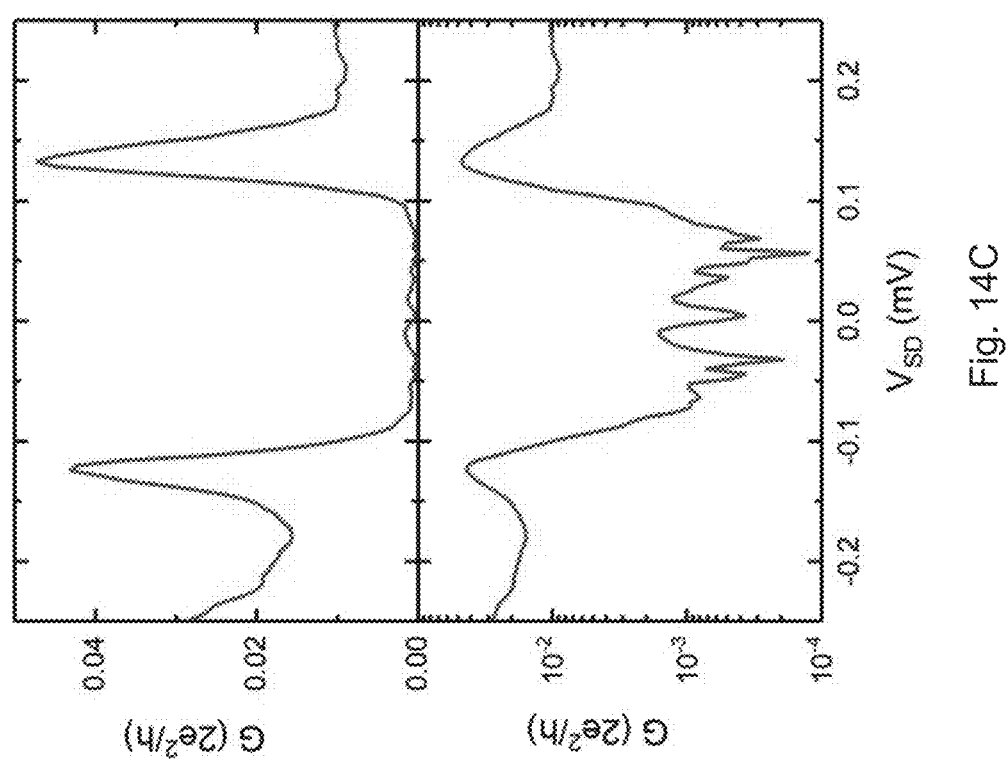
Fig. 14C
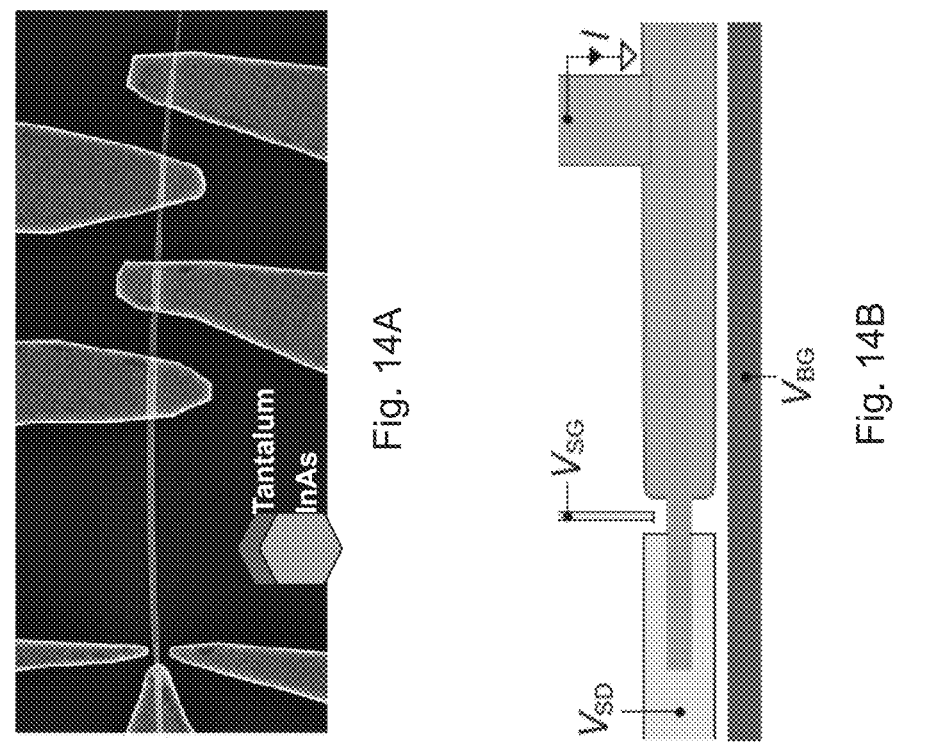
Fig. 14A
Fig. 14B

METHOD FOR MANUFACTURE OF NANOSTRUCTURE ELECTRICAL DEVICES

CROSS-REFERENCE TO RELATED APPLICATIONS

This application is the national phase entry of International Patent Application No. PCT/EP2019/068197 filed on Jul. 8, 2019, and claims the benefit of European Patent Application No. 18182199.2 filed Jul. 6, 2018, the disclosures of which are hereby incorporated herein by reference in their entirety, for all purposes.

The present disclosure relates to nanostructures, in particular hybrid nanostructures with patterned growth of various layers for use in nanoscale electronic devices, such as hybrid semiconductor nanostructures with patterned growth and/or deposition of superconducting material for use in quantum devices. The presently disclosed method can be utilized for in-situ manufacturing of nanoscale electronic devices that have not been contaminated by ex-situ processes.

BACKGROUND OF INVENTION

Hybrid structures between semiconducting nanowires and superconductors are an emerging platform for superconducting electronics, in particular for engineering topologically protected quantum states which can be used as the basic building blocks of a quantum processor. The hybrid structures are also attractive for other superconducting quantum bits, so-called gatemons.

In order for such devices to work, the interface between the semiconductor and superconductor needs to be of high quality. WO 2016/001365 disclosed an epitaxial and atomically perfect interface between a semiconductor and a superconductor, which can be provided by growing the semiconductor and superconductor in a single grown-run, maintaining ultra-high vacuum during the whole process. The method disclosed in WO 2016/001365 has shown to reliably lead to semiconductor-superconductor hybrid structures with the crucial quality of a hard superconducting gap induced in the semiconductor density of states. For further processing into actual electrical devices, at least a part of the superconductor then typically needs to be removed by subsequent processing in order to incorporate the structures into relevant device architectures. The requirement for subsequent processing poses several challenges for the approach.

Fabrication recipes for selectively removing the superconductor without substantially damaging the semiconductor exist for the case of for example aluminium, see for example Albrecht et al., Nature 531, 206 (2016) and Deng et al., Science 354, 1557 (2016). Other relevant superconductors, such as niobium-based alloys, tantalum, vanadium, $MgB_2$, each have superior properties such as higher critical magnetic fields and higher transition temperatures and have crystal structures allowing epitaxial integration with relevant semiconductors, however, no known recipes exist which allow selective removal of these metals from the semiconductors. As a consequence, these combinations can hardly be explored.

Even in the cases where process recipes do exist, processing of the superconductor will often damage the semiconductor to some degree, possibly degrading device performance and introducing device-to-device variations.

Pending application EP 18163624 by the same inventors opened for the employment of arbitrary superconductors but the transfer of wires from the growth substrate to a substrate suitable for electronic devices, and post-growth processing is still a requirement. Such serial work where the device is designed around each nanowire is un-scalable and therefore unsuited in large scale applications. This concern must be considered for all applications of nanowires, and in particular in the case of topological information processing where post-growth processing of the nanowire hybrids poses a risk of degrading the delicate superconducting hard-gap properties. Scalable parallel fabrication of gate-tunable electrical devices in geometries relevant for applications in topological information processing as well as in application of nanowire field-effect transistors is therefore needed.

SUMMARY OF INVENTION

In general, the present disclosure relates relates to 1) specially designed growth substrates for growth of crystalline nanostructures comprising a layout for nanoscale devices, and 2) in-situ deposition of material on the growth substrate and nanostructures, utilizing the device layout of the growth substrate to create nanoscale electrical devices concurrent with patterned growth of crystalline nanostructures, such that nanowire based electrical devices can be manufactured in scalable wafer scale production substantially without the usual post-processing of the devices.

The nanoscale device layout can be vertically raised from the surface of the growth substrate, and thereby also vertically raised from the growth plane of the nanostructure, by means of selective etching to create vertically raised platforms that can create a shadow mask on the nanostructure under appropriate growth conditions. With appropriate control of the size and the configuration of the platform layout and the location of the platform in relation to the nanostructure, (at least a part of) the platform can be arranged to form a shadow mask on the nanostructure. As a platform can have the function of a shadow mask, the term "shadow structure" may be used herein interchangeably with the terms "platform" and "platform structure".

During deposition of material on the nanostructure, e.g. by means of a directional beam flux, for example from a deposition source, the location of the deposition source and/or the orientation of the beam flux, and/or the location and form of the platform(s) and the nanostructure, a platform can form a shadow mask on the nanostructure, such that material from the deposition source is not deposited on one or more selected surface areas on the nanostructure defined by the resulting shadow mask from the platform.

Junctions made using nanowires as both the nanostructure growth object and the shadow structure have been disclosed in WO 2017/153388 and in Gazibegovic Nature, 548, 434 (2017). One purpose of the present disclosure is to improve the control of this patterned growth. Another purpose is to reduce the need for post-processing of nanoscale devices.

In a first aspect the present disclosure therefore relates to a method for manufacturing a substrate for growth of crystalline nanostructures, the method comprising the step of depositing one or more layers of a crystal growth compatible dielectric material, e.g. an epitaxial growth condition compatible dielectric material, such as silicon oxide, in a predefined pattern on the surface of a crystal growth compatible substrate to create a predefined etch pattern of said crystal growth compatible material. Subsequently the substrate surface can be selectively etched around said etch pattern to provide at least one under-etched platform which is vertically raised from the (etched) substrate surface. By having the platform in a chemically stable material, etching can be provided around the shadow structure to create under-etching of the platform such that the platform is vertically displaced but substantially parallel to the substrate surface, which corresponds to the growth plane of the deposition material. The configuration, geometry and location of the platform structure can therefore be very precisely controlled and determined on a nano- and micron-scale.

Furthermore, the predefined pattern may comprise a layout for at least one source and/or at least one drain and/or at least one electrostatic gate-electrode for at least one nanoscale device. Hence, at least one electrically conducting layer can be deposited on top of the platform in order to define one or more sources and/or drains and/or gates for use in nanoscale electrical devices. The vertical displacement of the platform from the substrate surface and the etching profile can ensure that the electrically conducting layer on the platform can be electrically isolated. The platform can therefore realize an isolated metal wire or region which can be utilized as e.g. wires and connections in device architectures. The raised platform which can be covered in any type of material (dielectric, normal metal, superconductor, etc.) and still be isolated allows access to for example source, drain, and gate electrodes from the outside world without the need for post-growth processing Prior to the step of selective etching at least part of the predefined pattern and/or at least a part of the substrate surface can be masked in resist, e.g. in a predefined resist pattern. Thereby areas with and without under-etching can be more precisely defined, such for example a tilted facet can be formed next to a suspended bridge as exemplified in FIGS. 3A-B.

The herein disclosed preprocessing of a growth substrate to create platforms/nanoscale layouts thereon can also include a step of defining a nanostructure pattern for defining a growth pattern for one or more planar crystalline nanostructures and/or for one or more crystalline nanostructures that can be provided by bottom-up growth, where the growth position of the nanostructure is defined by a catalyst particle deposited on a growth surface, the bottom-up growth thereby typically leading to substantial one-dimensional structures, such as nanowires.

The present disclosure further relates to a substrate manufactured according to these methods.

The present disclosure also relates to a method for utilizing these substrates with platform and device layout for patterned deposition of material on the platform and on nanostructures, for provision of a nanoscale device, i.e. the method comprises the steps of providing a growth substrate having a substrate surface and at least one platform which is parallel to but vertically raised from the substrate surface. E.g. vertically raised by being supported by at least one support structure, e.g. such that at least one void is formed below the at least one platform. Subsequently at least one elongated nanostructure can then be grown from the substrate surface, for example in the vicinity of at least one of said platforms. Such that at least initially the growth plane of the nanostructure(s) is vertically offset from at least a part the platform. By controlling the growth direction at least one of said elongated nanostructures can be made to grow under a part of one of said platforms, e.g. in a void formed below a platform. At least a first layer of material can then be deposited on at least a part of the nanostructure(s) by means of at least a first deposition source.

Planar nanostructures can also be grown controllably under a raised platform. A growth pattern for one or more planar nanostructures can be defined, for example by means of optical or electron beam lithography, such that the planar structure growth pattern extends below a raised platform/shadow structure. The platform can be configured to be transparent to optical or electron beam lithography such that a growth pattern for planar nanostructures can be defined directly below a raised platform, see for example T. Doll, M. Hochberg, D. Barsic, A. Scherer "Micro-machined electron transparent alumina vacuum windows" Sensors and Actuators A, 87, 1, 52-59 (2000). The degree of for example electron transparency of a material depends on the material, and energy of the electrons. Materials such as Silicon Oxide or Silicon Nitride are effectively transparent when thinner than ~50-100 nm. Membranes of these materials are routinely used for support-grids in Transmission Electron Microscopes applications. Hence, Silicon Oxide or Silicon Nitride can be used to create the presently disclosed shadow structures.

Once a growth pattern is defined, a planar nanostructure can be grown in the growth pattern extending below the raised platform by means of diffusive growth, such that at least one planar nanostructure extends below at least one vertically raised platform, i.e. below a shadow structure. Diffusive growth relies on diffusion of growth material elements on the surface; i.e., there does not need to be a direct line of sight from between the growth source and the place where the crystal will grow below the shadow structure. Conversely, non-diffusive deposition typically takes place at low temperature (<100° C.), where diffusion is negligible such that a vertically raised platform will function as a shadow structure during non-diffusive deposition. Semiconductors are typically grown by diffusive growth whereas superconductors are typically deposited by means of non-diffusive deposition. I.e. a semiconductor layer can be defined below a shadow structure whereas a superconductor layer will be defined by the raised platform that forms a shadow for the deposition of the superconductor on the semiconductor.

Preferably the deposition source, the platform(s), and the nanostructure(s) are arranged such that, during deposition of said first layer(s), at least a part the platform(s) forms at least one shadow mask on the nanostructure(s) relative to the deposition source.

At least a part of the presently disclosed methods are performed under vacuum, preferably ultra-high vacuum, for example in one or more vacuum chambers. A major advantage of the presently disclosed approach is that the steps of growing at least one nanostructure and depositing the first layer—and optionally the second layer—can be performed without breaking the vacuum.

The presently disclosed approach, at least one embodiment thereof, can be said to be provided by means of a specially designed terraced growth substrate combined with positioned gold catalyst particles, a "kinked" nanowire growth sequence, and in situ angle-deposition of metal contacts. The nanowire growth and metal deposition is the last process steps; i.e. thereafter the device, e.g. a logical element, chip or processor, is finished. A route is therefore presented herein for growing hybrid nanostructures concurrent with actual device layouts without the drawbacks mentioned above—and the presently disclosed approach is furthermore applicable to substantially any type of crystal growth compatible material.

The devices that can be manufactured according to the presently disclosed approach are relevant for any use of nanowires in electrical devices, including superconductor hybrid structures for topological information processing, superconducting technologies, but also applications in sensor technologies and conventional electronics are relevant.

DESCRIPTION OF DRAWINGS

FIGS. 1A-D show cut-through side views of one example of the presently disclosed approach of vertically displacing a platform from a substrate surface.

FIG. 1E shows a SEM image of an example of an under-etched platform providing a part of the platform suspended from the substrate surface.

FIGS. 3A-E show cut-through side views of the provision of a nanowire growing under a suspended part of a platform.

FIGS. 4A-D show cut-through side views of the provision of an electrostatic gate over a nanowire junction provided on a nanowire grown by bottom-up growth.

FIGS. 5A-D show cut-through side views of the provision of an electrostatic gate over a nanostructure junction provided on a planar grown nanostructure.

FIG. 7A shows a top view of a finished nanoscale device circuit layout of a nanowire FET element that can be combined into a logical element. The layout in FIG. 7A comprises a source, a drain, and two gates with separate nanowire based junctions. Two of these FET elements can be combined into a logical-AND element as illustrated in FIGS. 7B-D. FIG. 7B shows the logical-AND symbol. FIG. 7C illustrates how the FET elements can be connected to form the logical-AND. FIG. 7D shows the resulting output from the logical-AND element.

FIG. 8A shows a close-up of an under-etched platform where the upper layer is provided in an electrically conducting material to provide an electrically insulated region. FIG. 8B shows a plurality of these identical platforms on a wafer.

FIGS. 9A-B show top-view schematics of bridge(s) for defining Majorana islands. FIGS. 9C-F show side-view schematics of process behind the illustrations in FIGS. 9A-B.

FIGS. 14A-C illustrates a confirmation of the existence of a hard induced gap in hybrid nanostructures fabricated using an approach similar to the presently disclosed approach.

DETAILED DESCRIPTION OF THE INVENTION

Figure 2:
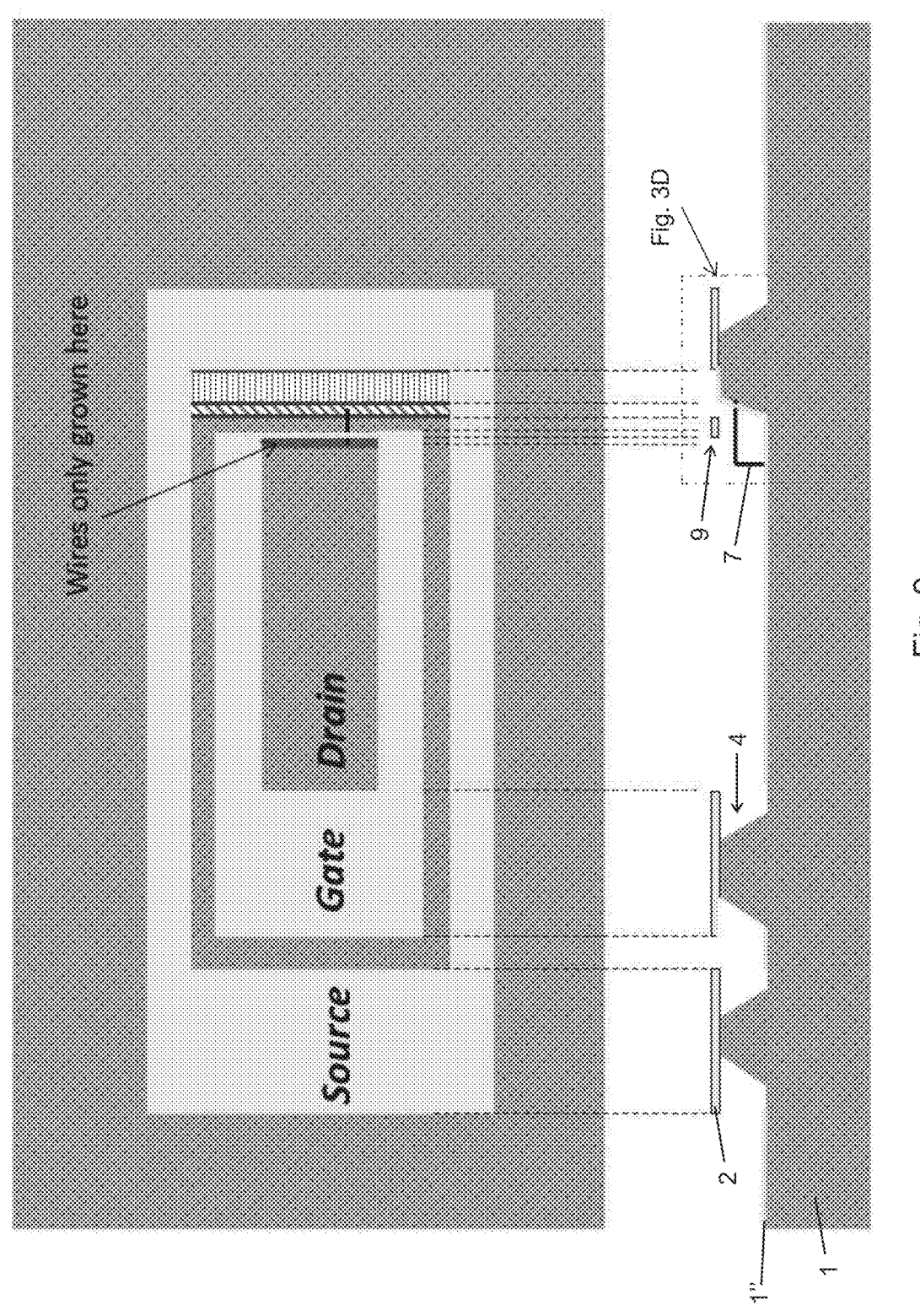
FIG. 2 shows top view (top) and corresponding cut-through side-view (below) of an example of a finished nanoscale device circuit layout. A platform has been defined on a substrate surface, the platform defining the layout of an electrical device with source, gate and drain.

The tunable qubit disclosed in WO 2016/000836 was based on a discovery presented in WO 2016/001365 wherein a nanoscale device (or nanometer scale) comprising an elongated crystalline semiconductor nanostructure, such as a nanowire (crystal) or nanowhisker (crystal) or nanorod (crystal), with epitaxial interfaces between the semiconductor and a metal was disclosed. WO 2016/001365 demonstrated the realization of an almost perfect (epitaxial) interface between a semiconductor and a superconductor in the form of a metal, in particular a hybrid nanostructure with InAs and Al. WO 2016/000836 and WO 2016/001365 are incorporated herein by reference in their entirety.

The present disclosure does not only relate to vertically grown and/or bottom-up grown nanostructures, such as nanowires, but to any nanostructure where a material needs to be selectively deposited, e.g. in a predefined pattern. I.e. the present disclosure also relates to nanostructures grown by planar growth, for example by means of selective area growth. In the case of nanostructures grown by planar growth, an insulating buffer is advantageously provided, e.g. by growing or depositing, below the planar grown nanostructure to ensure electrical isolation from the substrate surface.

The etch patterns and device layout as disclosed herein can be defined by means various methods known in the art, for example by means of lithography, such as optical lithography or e-beam lithography. Platform structures can then be realized by means of for example etching, e.g. wet etch and/or dry etch, or various liftoff techniques known in the art.

In the shadow structure approach disclosed in WO 2017/153388 the shadow structures in the form of neighboring nanowires were employed as part of the growth process, i.e. all process steps were provided in-situ. A major advantage of the presently disclosed approach is that the provision of a specially designed growth substrate with shadow platforms/device layouts thereon, can be provided beforehand, i.e. ex-situ, whereas the important process steps of growing the nanostructure, creating one or more patterned layers thereon and creating the actual devices, can still be provided in-situ. At least a part of these processes are typically provided under vacuum, and in particular the growth of the nanostructure(s) and the subsequent deposition of one or more layers can be provided without breaking the vacuum. The presently disclosed methods employing platform structures are therefore compatible with the normal in-situ crystal growth environment. The result is that almost any designs of nanostructure devices can be fabricated in situ under vacuum conditions, for example metal/superconductor-semiconductor wires can be designed to have metal/super-conductor deposited at specific segments of the wire. The approaches disclosed herein thereby eliminate the need for delicate processing in the fabrication of e.g. nanowire devices.

The presently disclosed method is furthermore flexible enough to be compatible with all currently relevant geometries for topological processors. The present approach also allows different materials at different segments, for example allowing (normal metal)-nanowire-(superconductor) structures to be directly grown. The method is highly relevant for future topological quantum processors and other applications in gate-tunable superconducting electronics, but is also applicable within applications of semiconductor nanowires where the quality and reproducibility of electrical contacts play an important role. The presently disclosed approach provides an important step towards up-scaling hybrid nanowire devices for applications as it will potentially reduce the device variation that inherently exists in hybrid materials like these.

The presently disclosed approach of defining planar nano-structure growth patterns below a raised platform provides a large flexibility of lithography in defining etch openings etc. The approach can also be used for creating complex structures as shown FIG. 9 which illustrates a top-view of a bridge structure used for defining three segments of a semiconductor nanowire, half-covered by superconductors. Such islands are potential element of a Majorana quantum bit. The shadow structure may also define areas on the substrate to act as local electrostatic gates for local tuning of density (occupation of islands, or tunnel-coupling between islands). This is however just an added benefit, and the un-wanted superconductor covering the substrate may also be removed subsequently by etching. Another example which demonstrates a network (or branching) structure is shown in FIG. 10. FIG. 11 shows an example where the technique defines a classical logical circuit—the RS latch or RS flip-flop—being a simple 1-bit memory. Obviously, the flexibility is large and FIGS. 9-11 are just examples. Also, the shadow structure can be horizontally off-set from the opening for planar growth if tilted angles are used for the metal-step—in the examples shown here there are no offset.

The present approach is relevant for all nanowire based electrical devices because handling of such delicate devices can be extremely difficult. The present approach eliminates some of most problematic and unpredictable steps from the fabrication of nanowire-based topological devices. An example of an S-NW-S junction is disclosed in WO 2016/000836 where it is used as a Josephson junction. The presently disclosed approach is directly applicable there, i.e. using a shadow structure to provide a gap in the supercon-ducting facet layer on a semiconductor nanowire. In this case the first facet layer is provided in a superconducting material which is deposited on the nanostructure, a small gap in the superconducting material is provided by the shadow mask formed by the shadow structure. This small gap may consequently constitute a Josephson junction manufactured in-situ that will have the highest possible quality because it is untouched by any top-down ex-situ process, i.e. it is 100% clean. If the nanostructure is furthermore a semiconductor and the superconductor first facet layer is deposited to provide an epitaxial match between the semiconductor and the superconductor, a semiconductor weak link is provided to form a semiconductor based Josephson junction manu-factured in-situ that will have the highest possible quality, i.e. it is 100% clean. Using the terms of the disclosure in WO 2016/000836 a Josephson junction can be provided by means of the presently disclosed method. The Josephson junction comprising an elongated hybrid nanostructure com-prising superconductor and semiconductor materials and a weak link, wherein the weak link is formed by a semicon-ductor segment of the elongated hybrid nanostructure wherein the superconductor material is exposed, e.g. it has been removed, by means of the shadow structure to provide a semiconductor weak link.

A hard superconducting gap has also been demonstrated in InSb semiconductor nanowires with an NbTiN supercon-ducting layer (Gül et al., Nano Lett. (2017) 2690-2696 and Zhang et al., Nature Communications (2017), 10.1038/ncomms16025). In that case there was no epitaxial interface between the semiconductor and the superconductor, but a hard gap was provided due to an improved homogeneous interface between the semiconductor and the superconductor and a barrier-free electrical contact. The presently disclosed approach where growth and subsequent patterned deposition can be provided without breaking the vacuum helps to ensure a very clean and barrier-free interface.

The present disclosure relates to a method for provision of a nanoscale device, the method comprising the steps of providing a growth substrate having a substrate surface and at least one platform which is parallel to but vertically raised from the substrate surface, growing at least one elongated nanostructure from the substrate surface in the vicinity of at least one of said platforms, and preferably controlling the growth direction such that at least one of said nanostructures grows under a part of one of said platforms. There are different ways to control the growth direction of bottom-up growing nanostructures, where kinking the growth direction is one example of that.

Controlling the kink direction of a nanowire can be challenging, but there are ways to solve this. In the worst case scenario, i.e. no control, the nanowires kink with equal probability in the six directions determined by the initial vertical growth, leading to a success-rate of having a nanow-ire kinked under a suspended part of the platform of 50%. This includes nanowires kinking at a non-perpendicular angle to the suspended part of the platform.

The control of the growth of the nanostructures can be provided such that at least one of the nanostructures grows under a part of a (suspended) platform and grows to physi-cally contact/merge with a structure supporting the platform (the same platform or a different one), as illustrated in a scanning electron micrograph in FIG. 4E.

The method may further comprise the step of depositing at least a first layer of material on the platform and on at least a part of the nanostructure(s) by means of at least a first deposition source, wherein the deposition source, the plat-form(s) and the nanostructure(s) are arranged such that, during deposition of said first layer(s), at least a part of the platform(s) forms at least one (first) shadow mask on the nanostructure(s) relative to the deposition source.

Yet a further step may be to deposit at least a second layer of material on at least a part of the nanostructure(s) by means of at least a second deposition source, wherein the second deposition source, the platform(s) and the nanostructure(s) are arranged such that, during deposition of said second layer(s), at least a part of the platform(s) forms at least one (second) shadow mask on the nanostructure(s) relative to the deposition source. By appropriate arrangement of the plat-form, the nanostructure and the deposition source the first shadow mask may be displaced from the second shadow mask. E.g. if the first and second deposition source during deposition are located differently such that the depositions are provided from different angles, the location of the shadow mask, which is cast on the nanostructure, is also different.

The first layer and/or the second layer may be selected from the group of semiconductors, superconductors, metals, magnetic materials, oxides and dielectrics. The material of the second layer may be different from the material of the first layer.

The first layer and/or the second layer may be a conduct-ing material, such as metal, and wherein at least one plat-form and at least one nanostructure are arranged such that the part of said platform suspended in the vicinity of said nanostructures becomes an electrostatic gate of the nano-structure, for example in the form of an electrostatic side gate. The gate-coupling can be enhanced by kinking the nanowires at a height close to a suspended part of the platform. Alternatively the gate-coupling can be controlled by filling the air-gap between the nanowire and the sus-pended part of the platform, by an appropriate dielectric providing conformal coating, e.g. by means of atomic layer deposition.

As disclosed in pending application EP 18163624, the suspended part of the platform, aka the bridge, can have different designs depending on the desired device architecture. In this approach special attention must be given to the design as the bridge may also act as an active element of the device when functioning as gate.

Controlling the kink direction of a nanowire can be challenging, but there may be ways to solve this. In the worst case scenario, i.e. no control, the nanowires kink with equal probability in the six directions determined by the initial vertical growth, leading to a success-rate of having a nanowire kinked under a suspended part of the platform of 50%. This includes nanowires kinking at a non-perpendicular angle to the suspended part of the platform.

Planar grown nanostructures, e.g. by means of e.g. selective area growth, featuring an insulating buffer layer, could lead to a much higher yield, potentially close to 100% yield.

The nanowires are typical in epitaxial connection to the supporting substrate. This is not a problem for individual devices, but it may provide a leaking path between "drains" of different device elements. The issue can be avoided by growing on insulating lattice matched substrates, such as Fe-doped InP, by growing on substrates containing a deep insulating buffer and deep etching between individual elements, or by starting the growth with a high-band gap segment providing a Shottky barrier. Other routes may also exist to deal with this issue, for example growing self-catalysed on Si. The most cost efficient option would likely be to use Si substrates with $HfO_2$ bridges; the etch could be $HF:H_2O_2$ or something that doesn't etch $HfO_2$ as fast as Si.

Even further, the platform may comprise a layout for at least one source and/or at least one drain for at least one nanoscale device and such that the first layer and/or the second layer adds to this layout to form said least one source and/or said at least one drain to be part of an electrical nanoscale device manufactured in-situ.

In the preferred embodiment the nanostructures are elongated nanostructures, such as elongated crystalline nanostructures, such as elongated crystalline semiconductor nanostructures, i.e. with one physical dimension of the nanostructures being considerable larger than the other two dimensions. The nanostructures may also be substantially one-dimensional, like a wire, e.g. in the form of nanowires.

The at least first and/or second layer can be substantially any kind of material, e.g. crystal growth compatible material, for example selected from the group of semiconductors, superconductors, metals, magnetic materials, oxides and dielectrics. The nanostructures may be provided by bottom-up growth and/or planar growth and are preferably selected from the group of nanowires (crystals) or nanowhiskers (crystal) or nanorods (crystals).

The nanostructures may comprise a plurality of substantially plane side facets, which is typical for nanowires. Further, the growth positions of nanostructures on the substrate can be determined by means of one or more catalyst patterns, such as defined on the surface of the substrate, preferably by means of lithography. Growth from random locations can also be provided if growth positions are not defined by a catalyst pattern. For bottom-up growth the growth direction of at least a part of the nanostructure(s) can be kinked during growth.

As an alternative to bottom-up growth the presently disclosed shadow structure approach can also be applied to planar structures, which typically are provided by growth in a plane substantially parallel to the substrate surface. The regions for planar growth can be defined in a layer of crystal growth compatible dielectric, such as silicon oxide, such that the planar growth occurs under the platform and such that they for example span between the source and drain contacts.

In a further process step substantially the entirety of the at least one nanostructure can be covered with at least one final layer, a final layer such as an oxide coating, i.e. a suitable dielectric. Such a final covering of the whole (or part of) structure can be seen as a coating provided for passivating and/or protecting the whole device. Normally post-processing would be needed to finalize the device, but in the approach disclosed herein the nanostructure can be grown and additional layers can be provided in a predefined pattern, i.e. post-processing can be avoided. It is then a major advantage to be able to protect the device, e.g. thereby passivating a semiconductor nanostructure in a suitable dielectric.

The growth of the nanostructures and the patterned deposition of one or more layers can be provided in a vacuum chamber, and the first and/or second deposition source can be a vapor deposition source (e-gun evaporation, thermal evaporation, laser-ablation, sputtering, Knudsen cell, etc). The vacuum chamber and the deposition source(s) can then be configured to provide a directional beam flux from the deposition source(s) during deposition.

A crystal growth compatible material is a material that can be deposited on substrate suitable for crystal growth and which is compatible for subsequent use in a crystal growth process, e.g. a vacuum or ultra-high vacuum (UHV) process, such as MBE. Several oxide materials can be used as crystal growth compatible material, commonly used examples are silicon oxide, aluminium oxide, hafnium oxide and silicon nitride.

Hybrid Nanostructure

One key aspect when integrating superconductor and semiconductor technology has been the realization of an almost perfect interface between a semiconductor and a superconductor in the form of a metal, in particular a hybrid nanostructure with InAs and Al. Semiconductor/metal (SE/M) interfaces have until recently been uncontrolled on the atomic scale. However, nanoscale devices (or nanometer scale) comprising an elongated crystalline semiconductor nanostructure, such as a nanowire (crystal) or nanowhisker (crystal) or nanorod (crystal), with epitaxial interfaces between the semiconductor and a metal has been disclosed.

These nanoscale devices have been realized and exemplified by means of bottom-up growth of semiconductor/metal core-shell nanowire crystals by a combination of VLS and molecular beam epitaxy (MBE). However, as also noted in the present disclosures, planar (elongated) hybrid nanostructures can be realized also with epitaxial interfaces between semiconductor and superconductor, for example also by a combination of VLS and MBE.

One example uses InAs for the nanostructure crystal and Al is grown with epitaxially matched interfaces, which can be regarded as the ultimate limit of disorder free contact. Under certain conditions, conventional superconductors can induce a topological non-trivial superconducting state in semiconductor nanowires. Proposals based on proximity effect in semiconductor nanowires with strong spin-orbit are appealing because the key ingredients are known in the art. However, all previous instances of proximitized semiconductors show significant tunneling conductance below the superconducting gap, suggesting a continuum of subgap states that nullifies topological protection—an unsolved issue referred to as the "soft gap problem". Such soft-gaps will induce decoherence of Majorana qubits, and has been considered a major road-block for the future of topological quantum information in such devices. But it turns out that the hardness of the induced superconductivity depends crucially on the quality and uniformity of the semiconductor/superconductor (SE/SU) interfaces. This situation is analogous to that of conventional semiconductor devices where the quality of the involved interfaces is the primary parameter determining the performance. For this reason, semiconductor technology was revolutionized by the invention of epitaxial growth of heterostructures, which enables atomic-scale design of semiconductor interfaces and tailor-made profiles of the electronic band structures, doping levels and strain. So far, however, the world of semiconductor epitaxy has had little to do with the world of superconductivity.

But with the advent of the InAs nanostructures with epitaxial Al it has been demonstrated that for temperatures below the superconducting transition temperature aluminum becomes superconducting and the Al layer induces a superconducting gap into the InAs by virtue of the proximity effect. In contrast to all previous studies, however, the induced gap remains hard i.e., free of subgap states, likely due to the perfectly uniform InAs/Al interface. The soft-gap problem has therefore been solved, because a hard superconducting gap induced by proximity effect in a semiconductor, is demonstrated by using epitaxial Al—InAs superconductor-semiconductor hybrid nanostructures. As also mentioned previously a hard superconducting gap has been demonstrated in InSb semiconductor nanowires with an NbTiN superconducting layer (Gül et al., Nano Lett. 2017, 2690-2696) where the interface between semiconductor and superconductor is not epitaxial, but merely very clean and free of impurities.

In the presently disclosed approach, the first layer and/or second layer and/or additional layers can for example be crystalline and epitaxial, crystalline and non-epitaxial or even amorphous. An important aspect is that the presently disclosed method allows for defining one or more patterned layers without the need for processing or ever breaking the vacuum. In this way, the presently disclosed method increases the potential material combinations since it is not necessary to develop special methods to either achieve an epitaxial match, or find the correct cleaning/passivation solution for each material.

The nanostructure may be provided in a semiconducting material, e.g. a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations. The deposited first and/or second layer may naturally be a metal but may be many types of materials. Further, the deposited layer(s) may be provided in a material with superconducting properties below a critical temperature $T_c$. A preferred crystalline semiconductor nanostructure may be InAs, in particular because InAs nanostructures allow for high quality field effect JJs due to the highly transparent Schottky barrier-free SN interface.

The nanostructure may be crystalline, i.e. it is a single crystal or it is composed of several crystals, e.g. large single crystal elements, forming a crystalline structure. In some embodiments the elongated crystalline nanostructure may be seen as a substantially one-dimensional crystalline structure. It has been demonstrated in InAs with an Al facet layer with Wurtzite(WZ)/FCC or Zinc Blende(ZB)/FCC crystal orientations, which can form uniform crystal morphologies and highly ordered and well defined epitaxial SE/M interfaces between the semiconductor (SE, e.g. InAs) and the metal (M, e.g. Al). However, the epitaxial match can be realized with other material combinations with similar structures and lattice spacings. For relevant FCC metals this could for example be Au and Ag, and for semiconductors this is for example the other members of the '6.1 Å family': GaSb and AlSb. Hence, high quality epitaxial growth of contacts to crystalline nanostructures can therefore be realized with many material combinations.

Hybrid nanostructures for Josephson junctions are typically superconducting along the longitudinal direction of the nanostructure, e.g. like a superconducting wire, and the weak link to be used in the JJ is created by removing superconducting material from a segment of the hybrid nanostructure by means of a shadow mask defined by shadow structure thereby breaking the superconducting properties in a small segment (the gap in the surface layer(s)) of the nanostructure.

In one embodiment the nanostructure is an elongated hybrid nanostructure comprising an elongated crystalline semiconductor nanostructure having at least one substantially plane side facet, and a crystalline superconductor first facet layer deposited on at least one side facet along at least part of the length of the crystalline semiconductor nanostructure, wherein the crystalline structure of the semiconductor nanostructure is epitaxially matched with the crystalline structure of the first facet layer on the interface formed between the semiconductor nanostructure and the crystalline superconductor.

In a further embodiment the elongated hybrid nanostructure comprises an elongated crystalline semiconductor nanostructure having a plurality of substantially plane side facets, and a crystalline superconductor first facet layer covering one or more of said plane side facets of at least part of the length of the crystalline semiconductor nanostructure, wherein the crystalline structure of the semiconductor nanostructure is epitaxially matched with the crystalline structure of the first facet layer on the interface of at least one side facet, and wherein the weak link is formed by a semiconductor segment of the elongated hybrid nanostructure where the first facet layer has been removed by means of a nanostructure shadow mask provided during surface layer deposition to provide a semiconductor weak link.

Having an epitaxial match between the semiconductor and the superconductor has at least one major effect. The superconductor first layer forms an atomically precise SN interface leading to a proximity induced gap in the semiconductor nanostructure with a low density of states below the superconducting gap. In other words, the epitaxial match generates a hard gap.

In one embodiment of the invention each two-dimensional interface between a crystalline nanostructure and a deposited layer is lattice matched and/or domain matched in at least one dimension, possibly in both dimensions.

Naturally the first layer may be crystalline. The two-dimensional interface between a crystalline nanostructure and the deposited layer may be epitaxial. However, as also described above it may suffice than the interface is homogeneous and free of impurities but non-epitaxially matched. The two-dimensional interfaces between the crystalline nanostructure and the deposited layer(s) may be epitaxial, such as simultaneously epitaxially matched. Thus, the crystalline structure of the nanostructure may be epitaxially matched with the crystalline structure of the deposited layer. In one embodiment each two-dimensional interface between the crystalline nanostructure and the deposited layer(s) is simultaneously epitaxially matched, domain matched and lattice matched in both dimensions.

Epitaxial match in the interface between two crystalline layers may not be entirely unusual if the crystal structures of the two crystalline layers are equal. However, it has been demonstrated that an epitaxial interface can be realised even when the crystal structure (and/or crystal phase) of the crystalline nanostructure is different from the crystal structure (and/or crystal phase) of the deposited layer, such as when the crystal structure (and/or crystal phase) of the elongated crystalline nanostructure and the crystal structure (and/or crystal phase) of the deposited layer(s) belong to different lattice systems and/or if the Bravais lattice of the elongated crystalline nanostructure is different from the Bravais lattice of the deposited layer(s). If for example the crystal structure of the elongated crystalline nanostructure is zincblende (ZB) then the crystal structure of the deposited layer(s) is not zincblende, i.e. the crystal structures are different. Correspondingly if for example the crystal structure of the elongated crystalline nanostructure is wurtzite then the crystal structure of the deposited layer(s) is not wurtzite, i.e. the crystal structures are different. E.g. the crystal structure of the elongated crystalline nanostructure may be zincblende (ZB) or wurtzite (WZ) and the crystal structure of the facet layer belongs to the cubic crystal system, such as primitive cubic, BCC or FCC, as demonstrated previously with InAs nanowires (ZB or WZ) with an Al (FCC) epitaxially matched deposited layer(s).

The elongated crystalline nanostructure may be homogeneous, i.e. formed from the same compound material in the longitudinal/axial direction and/or in the radial direction. However, the elongated crystalline nanostructure may in itself be a heterogeneous structure, e.g. a heterostructured nanowire crystal. E.g. the crystalline nanostructure may be a heterostructured nanowire crystal composed of different compounds in the axial and/or radial direction.

As previously stated it is unusual that an epitaxial interface is provided between layers having different crystal structures and this opens for epitaxial interfaces between semiconductors (which are often wurtzite or zincblende) and metals (which are often BCC or FCC). In one embodiment the deposited layer(s) is hence a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W. Some of these metals become superconducting below a critical temperature. However, deposited layers of other materials may as well be provided where an epitaxial interface to the nanostructure can be realised, e.g. selected from the group of high temperature ceramic superconductors, such as copper oxide or cuprate superconductors, which often have a perovskite crystal structure. Other possible superconductors are superconducting alloys such as NbN, NbTiN, NiGe, NbSn, and $MgB_2$.

The cross-section of a nanowire may e.g. be square, hexagonal, or octagonal providing a total of four, six or eight side facets, respectively. Consequently, a deposited (facet) layer may be covering at least a part of 1, 2, 3, 4, 5, 6, 7, 8 or more of the side facets.

The thickness of the deposited layer(s) may be less than 300 nm, or less than 250 nm, or less than 200 nm, or less than 150 nm, or less than 100 nm, or less than 90 nm, or less than 80 nm, or less than 70 nm, or less than 60 nm, or less than 50 nm, or less than 45 nm, or less than 40 nm, or less than 35 nm, or less than 30 nm, or less than 25 nm, or less than 20 nm, or less than 19 nm, or less than 18 nm, or less than 17 nm, or less than 16 nm, or less than 15 nm, or less than 14 nm, or less than 13 nm, or less than 12 nm, or less than 11 nm, or less than 10 nm, or less than 9 nm, or less than 8 nm, or less than 7 nm, or less than 6 nm, or less than 5 nm.

At the initial stage of the growth of the deposited layer(s) islands may form at the nanostructure surface. During this growth the temperature of the substrate may play an important role with regard to the spacing between the islands. If the temperature is low enough, the spacing is so small that the islands will merge at a very thin thickness of the deposited layer(s). As discussed further below this may lead to surface driven grain growth. A thickness of the deposited layer(s) below 15 nm may only be obtained if the temperature during growth/deposition of the facet layer is below −20° C., or below −25° C., or even below −30° C. This is particular the case for Al and possibly Pb. However, for other materials thin layers can be obtained at room temperature.

In the case of bottom-up grown elongated crystalline nanostructure, such as nanowires, the cross-sectional diameter of the nanostructure may be between 10 and 200 nm, such as between 10 and 20 nm, or between 20 and 30 nm, or between 30 and 40 nm, or between 40 and 50 nm, or between 50 and 60 nm, or between 60 and 70 nm, or between 70 and 80 nm, or between 80 and 90 nm, or between 90 and 100 nm, or between 100 and 110 nm, or between 110 and 120 nm, or between 120 and 140 nm, or between 140 and 160 nm, or between 160 and 180 nm, or between 180 and 200 nm.

The length of the nanostructure may be between 1 and 50 μm, or between 1 and 2 μm, or between 2 and 3 μm, or between 3 and 4 μm, or between 4 and 5 μm, or between 5 and 6 μm, or between 6 and 7 μm, or between 7 and 8 μm, or between 8 and 9 μm, or between 9 and 10 μm, or between 10 and 12 μm, or between 12 and 14 μm, or between 14 and 16 μm, or between 16 and 18 μm, or between 18 and 20 μm, or between 20 and 50 μm. This applies to both planar grown and bottom-up grown nanostructures.

In the case of planar grown planar structures the width in the plane of the growth surface can be much larger than the height perpendicular to the growth surface, i.e. the direction of the growth, however still smaller than the length of the nanostructure. The width can typically be between 50 nm and 1 μm, e.g. on order of hundreds of nanometres. The height of a planar nanostructure is normally between 5 and 500 nm, typically between 100 and 200 nm.

In one embodiment of the present invention, the length of the semiconductor segment, e.g. the spacing between the metal segments, is between 10 and 500 nm, or between 20 and 400 nm, or between 40 and 300 nm, more preferably between 100 and 250 nm, most preferably between 150 and 200 nm.

The platform structures are typically offset from the substrate surface such that a shadow mask can be created on an adjacent nanostructure for a suitable deposition angle. Hence, preferably the upper surface of at least a part of the shadow structure(s) is vertically offset from the substrate surface by at least 500 nm, or by at least 1 μm, or by at least 2 μm, or by at least 5 μm. This would typically apply to for example kinked nanowire growth. However, for planar growth this vertical offset should typically be smaller such that the gate ends up closer to the nanostructure, preferably less than 500 nm, possibly as low as less than 200 nm or less than 100 nm.

In yet another embodiment of the present invention, the cross-section of the crystalline semiconductor nanostructure is square, thereby providing a total of four side facets or hexagonal, thereby providing a total of six side facets.

Growing Nanowires with an Epitaxial Facet Layer

Elongated nanostructures, and in particular elongated crystalline semiconductor nanostructures, may be grown at elevated temperatures, e.g. above 300° C., above 350° C., or above 400° C., e.g. in the normal direction on a plane substrate. Importantly the deposited layer(s) is grown/deposited directly on at least one plane surface of the crystalline semiconductor nanostructure at a much reduced temperature compared to what has previously been tried, e.g. below 50° C. or below 20° C. To provide a thin deposited layer(s), e.g. on the order of 10 nm, the temperature can be reduced even further, i.e. below 0° C., or below −5° C., or below −10° C., or below −15° C., or below −20° C., or below −25° C., or below −30° C. The reduction in temperature may also help to prevent any material sticking at the semiconductor surface before the deposited layer(s) is deposited. An oxide free interface between the surface of the semiconductor and the deposited layer(s) is thereby obtained, i.e. an oxide free epitaxial interface/contact between a semiconductor nanostructure and a metal/superconductor can be obtained. As demonstrated previously, nanowires grown in the conventional $[0001]_{WZ}/[111]_{ZB}$ direction have a facet layer in the form of a cubic metal phase with the [11-2] normal to the side facets of the nanowire and [111] along the nanowire axis. This is indeed unique because the symmetry allows large single crystal segments with simultaneous epitaxial match on all facets of the nanowire.

As previously demonstrated: If the deposited layer is deposited at very low temperature it is possible to grow a layer such that the two-dimensional interface between the deposited layer and the elongated crystalline nanostructure is epitaxially matched, even when the nanostructure and the deposited layer have fundamentally different crystal structures. This opens the door for epitaxial matches between semiconductors and metals on the plane surfaces of hybrid nanostructures, like nanowires or planar nanostructures. The key issue in the growth method is the low temperature when depositing the layer to provide for initial surface driven growth of small crystal grains of the deposited layer. Thus, after the elongated nanostructures have been grown, all sources (e.g. in an MBE chamber) must be shut off such that the growth chamber is empty and then lowering the temperature, which can be lowered to below 0° C. or much lower, within seconds or minutes if external cooling sources like liquid nitrogen is used. This is not crucial for all superconductors. Ti is for example well known to form uniform films of a thickness less than 5 nm at room temperature.

The background pressure may also be reduced before the provision of the first facet layer. If the process takes place in a vacuum chamber, the background pressure may be reduced. This may also help to prevent any material sticking at the nanowire surface before the first facet layer is deposited.

In order to hit a plane surface, e.g. the side facet(s) of the elongated crystalline nanostructures or the top surface of a planar nanostructure, when depositing a layer, the source of the deposited layer may be located at a finite angle, e.g. less than 10 deg or less than 5 deg, such as 2-3 degrees, (e.g. inside an MBE vacuum chamber) to the normal direction of the substrate during deposition of the layer. In order to cover additional side facets of an elongated crystalline nanostructure, such as a nanowire, the substrate may be rotated during deposition of the facet layer. This rotation may also be provided to ensure that a gap is provided in a deposited layer when a shadow mask is provided. However, in other situations the angles could be anything from 5 to 85 deg, e.g. depending on the geometry of the platforms. Rotation can also be avoided in many situations.

As also stated previously the temperature of the substrate before deposition of the layer may preferably be reduced to a temperature below 10° C., or below 0° C., or below −5° C., or below −10° C. or below −15° C., or below −20° C., such as below −25° C., more preferably below −30° C. These low temperatures have been realized in a standard MBE chamber by reducing the background pressure and waiting for several hours. However, the temperature may be reduced much faster by applying an external source of cooling, e.g. liquid nitrogen, to cool the substrate. Even lower temperatures for depositing/growing the facet layer can then be reached. However, most importantly the time to reach the low temperatures can be much reduced.

As also stated elsewhere epitaxial interfaces are not a necessity in order to obtain for example a hard gap. I.e. low temperature deposition is not necessary in order to obtain a homogeneous and impurity free interface, in particular when the growth and deposition processes can be carried out without breaking the vacuum ensuring clean growth and deposition conditions.

Epitaxial Domain Matching for Other Material Combinations

It may be difficult to predict material combinations which will form epitaxial interfaces. For example, surface diffusion lengths of metals on semiconductors are not generally available in the literature, and for a given metal, the large number of possible planes and surface orientations makes it difficult to predict domain matches. However, in the thick shell limit, where strain and grain boundary driven growth dominates, the lowest energy configuration is most likely when the SE and M crystals with similar symmetry groups (ZB or WZ and FCC) orientate along the same type of symmetry classes, especially if the bicrystal match is not to large. For nanowires grown in the conventional $[0001]_{WZ}/[111]_{ZB}$ direction, a cubic metal phase with the [11-2] normal to the facets and [111] along the nanowire axis is unique in that its symmetry allow large single crystal segments with simultaneous epitaxial match on all facets of the nanowire. Thus, it is natural to expect, that if this orientation matches the semiconductor for a particular metal, it is likely to form in the thick film limit. Thus it is interesting to search among the cubic metals for matches in this orientation. Table 1, 2 and 3 list the domain strains for a range of metals grown on the important cases of InAs, InSb, and GaAs. In the general notation $$\left(\frac{n_{M,\square}}{n_{SE,\square}}, \varepsilon_\square\right) \times \left(\frac{n_{M,\perp}}{n_{SE,\perp}}, \varepsilon_\perp\right),$$

we distinguish between interfacial match of interfacial units in the components and the corresponding strain along the length and along the transverse direction to the NW, as expected from relaxed bulk values.

If ZB and FCC orientation along the same type symmetry classes, the two numbers are identical in the parallel and perpendicular directions. The tables below are suggestions for possible feasible material combinations—combinations without match in the tables may form epitaxial interfaces in other orientations.

TABLE 1

Domain matching for InAs with different cubic metals in the [11-2] out-of-plane orientation.

| Domain fraction ZB//FCC | | ½ | ⅓ | ⅔ | ¼ | ¾ | ⅕ | ⅖ | ⅗ | ⅘ |
|---|---|---|---|---|---|---|---|---|---|---|
| FCC metal | Lattice const. | 0.5 | 0.333 | 0.667 | 0.25 | 0.75 | 0.2 | 0.4 | 0.6 | 0.8 |
| Ne | 4.43 | 31.6 | 54.4 | 8.8 | 65.8 | 2.6 | 72.6 | 45.3 | 17.9 | 9.4 |
| Al | 4.05 | 25.2 | 50.1 | 0.3 | 62.6 | 12.2 | 70.1 | 40.2 | 10.2 | 19.7 |
| Ar | 5.26 | 42.4 | 61.6 | 23.2 | 71.2 | 13.6 | 77.0 | 53.9 | 30.9 | 7.9 |
| Ca | 5.58 | 45.7 | 63.8 | 27.6 | 72.9 | 18.6 | 78.3 | 56.6 | 34.9 | 13.1 |
| Ni | 3.52 | 13.9 | 42.6 | 14.7 | 57.0 | 29.1 | 65.6 | 31.2 | 3.3 | 37.7 |
| Cu | 3.61 | 16.1 | 44.1 | 11.9 | 58.0 | 25.9 | 66.4 | 32.9 | 0.7 | 34.3 |
| Kr | 5.72 | 47.0 | 64.7 | 29.4 | 73.5 | 20.6 | 78.8 | 57.6 | 36.5 | 15.3 |
| Sr | 6.08 | 50.2 | 66.8 | 33.6 | 75.1 | 25.3 | 80.1 | 60.1 | 40.2 | 20.3 |
| Rh | 3.8 | 20.3 | 46.9 | 6.3 | 60.1 | 19.6 | 68.1 | 36.2 | 4.3 | 27.5 |
| Pd | 3.89 | 22.1 | 48.1 | 3.8 | 61.1 | 16.8 | 68.9 | 37.7 | 6.6 | 24.6 |
| Ag | 4.09 | 25.9 | 50.6 | 1.3 | 63.0 | 11.1 | 70.4 | 40.8 | 11.1 | 18.5 |
| Xe | 6.2 | 51.1 | 67.4 | 34.9 | 75.6 | 26.7 | 80.5 | 60.9 | 41.4 | 21.8 |
| Ce | 5.16 | 41.3 | 60.9 | 21.7 | 70.6 | 11.9 | 76.5 | 53.0 | 29.6 | 6.1 |
| Yb | 5.49 | 44.8 | 63.2 | 26.4 | 72.4 | 17.2 | 77.9 | 55.9 | 33.8 | 11.7 |
| Ir | 3.84 | 21.1 | 47.4 | 5.2 | 60.6 | 18.3 | 68.4 | 36.9 | 5.3 | 26.2 |
| Pt | 3.92 | 22.7 | 48.5 | 3.0 | 61.4 | 15.9 | 69.1 | 38.2 | 7.3 | 23.6 |
| Au | 4.08 | 25.8 | 50.5 | 1.0 | 62.9 | 11.4 | 70.3 | 40.6 | 10.9 | 18.8 |
| Pb | 4.95 | 38.8 | 59.2 | 18.4 | 69.4 | 8.2 | 75.5 | 51.0 | 26.6 | 2.1 |
| Ac | 5.31 | 43.0 | 62.0 | 23.9 | 71.5 | 14.4 | 77.2 | 54.4 | 31.5 | 8.7 |
| Th | 5.08 | 40.4 | 60.2 | 20.5 | 70.2 | 10.6 | 76.1 | 52.3 | 28.4 | 4.6 |
| ZB//BCC | | | | | | | | | | |
| Li | 3.49 | 13.2 | 42.1 | 15.7 | 56.6 | 30.2 | 65.3 | 30.6 | 4.2 | 38.9 |
| Na | 4.23 | 28.4 | 52.3 | 4.5 | 64.2 | 7.4 | 71.4 | 42.7 | 14.1 | 14.6 |
| K | 5.23 | 42.1 | 61.4 | 22.8 | 71.0 | 13.1 | 76.8 | 53.7 | 30.5 | 7.3 |
| V | 3.02 | 0.3 | 33.1 | 33.7 | 49.8 | 50.5 | 59.9 | 19.8 | 20.4 | 60.5 |
| Cr | 2.88 | 5.2 | 29.9 | 40.2 | 47.4 | 57.8 | 57.9 | 15.9 | 26.2 | 68.3 |
| Fe | 2.87 | 5.5 | 29.6 | 40.7 | 47.2 | 58.3 | 57.8 | 15.6 | 26.7 | 68.9 |
| Rb | 5.59 | 45.8 | 63.9 | 27.7 | 72.9 | 18.7 | 78.3 | 56.6 | 35.0 | 13.3 |
| Nb | 3.3 | 8.2 | 38.8 | 22.4 | 54.1 | 37.7 | 63.3 | 26.6 | 10.2 | 46.9 |
| Mo | 3.15 | 3.8 | 35.9 | 28.2 | 51.9 | 44.2 | 61.5 | 23.1 | 15.4 | 53.9 |
| Cs | 6.05 | 49.9 | 66.6 | 33.2 | 75.0 | 24.9 | 80.0 | 59.9 | 39.9 | 19.9 |
| Ba | 5.02 | 39.7 | 59.8 | 19.5 | 69.8 | 9.5 | 75.9 | 51.7 | 27.6 | 3.5 |
| Eu | 4.61 | 34.3 | 56.2 | 12.4 | 67.1 | 1.4 | 73.7 | 47.4 | 21.2 | 5.1 |
| Ta | 3.31 | 8.5 | 39.0 | 22.0 | 54.2 | 37.3 | 63.4 | 26.8 | 9.8 | 46.4 |
| W | 3.16 | 4.1 | 36.1 | 27.8 | 52.1 | 43.8 | 61.7 | 23.3 | 15.0 | 53.4 |

TABLE 2

Domain matching for InSb with different cubic metals in the [11-2] out-of-plane orientation.

| Domain fraction | | ½ | ⅓ | ⅔ | ¼ | ¾ | ⅕ | ⅖ | ⅗ | ⅘ |
|---|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |

TABLE 2-continued

Domain matching for InSb with different cubic metals in the [11-2] out-of-plane orientation.

| Domain fraction | ½ | ⅓ | ⅔ | ¼ | ¾ | ⅕ | ⅖ | ⅗ | ⅘ |
|---|---|---|---|---|---|---|---|---|---|
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |

*Note: The Pb/Ac/Th rows contain 10 data values; the first value (under ½) is the lattice constant column.*

| | | | | BCC | | | | | |
|---|---|---|---|---|---|---|---|---|---|
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

TABLE 3

Domain matches for GaAs with different cubic metals in the [11-2] out-of-plane orientation.

| Domain fraction | ½ | ⅓ | ⅔ | ¼ | ¾ | ⅕ | ⅖ | ⅗ | ⅘ |
|---|---|---|---|---|---|---|---|---|---|
| fcc metal | lattice const | 0.5 | 0.333 | 0.667 | 0.25 | 0.75 | 0.2 | 0.4 | 0.6 | 0.8 |
| Ne | 4.43 | 26.9 | 51.2 | 2.5 | 63.4 | 9.7 | 70.7 | 41.5 | 12.2 | 17.0 |
| Al | 4.05 | 20.0 | 46.7 | 6.7 | 60.0 | 20.0 | 68.0 | 36.0 | 4.0 | 28.0 |
| Ar | 5.26 | 38.4 | 58.9 | 17.9 | 69.2 | 7.6 | 75.4 | 50.7 | 26.1 | 1.5 |
| Ca | 5.58 | 41.9 | 61.3 | 22.6 | 71.0 | 12.9 | 76.8 | 53.6 | 30.3 | 7.1 |
| Ni | 3.52 | 8.0 | 38.6 | 22.7 | 54.0 | 38.0 | 63.2 | 26.4 | 10.4 | 47.3 |
| Cu | 3.61 | 10.3 | 40.2 | 19.6 | 55.1 | 34.6 | 64.1 | 28.2 | 7.7 | 43.6 |
| Kr | 5.72 | 43.4 | 62.2 | 24.5 | 71.7 | 15.0 | 77.3 | 54.7 | 32.0 | 9.4 |
| Sr | 6.08 | 46.7 | 64.5 | 29.0 | 73.4 | 20.1 | 78.7 | 57.4 | 36.1 | 14.8 |
| Rh | 3.8 | 14.8 | 43.2 | 13.7 | 57.4 | 27.9 | 65.9 | 31.8 | 2.3 | 36.4 |
| Pd | 3.89 | 16.7 | 44.5 | 11.0 | 58.4 | 24.9 | 66.7 | 33.4 | 0.1 | 33.2 |
| Ag | 4.09 | 20.8 | 47.2 | 5.6 | 60.4 | 18.8 | 68.3 | 36.6 | 5.0 | 26.7 |
| Xe | 6.2 | 47.8 | 65.2 | 30.3 | 73.9 | 21.6 | 79.1 | 58.2 | 37.3 | 16.4 |
| Ce | 5.16 | 37.2 | 58.1 | 16.3 | 68.6 | 5.8 | 74.9 | 49.8 | 24.7 | 0.4 |
| Yb | 5.49 | 41.0 | 60.7 | 21.3 | 70.5 | 11.5 | 76.4 | 52.8 | 29.2 | 5.6 |
| Ir | 3.84 | 15.6 | 43.8 | 12.5 | 57.8 | 26.5 | 66.3 | 32.5 | 1.2 | 35.0 |
| Pt | 3.92 | 17.4 | 44.9 | 10.2 | 58.7 | 24.0 | 66.9 | 33.9 | 0.8 | 32.2 |
| Au | 4.08 | 20.6 | 47.1 | 5.9 | 60.3 | 19.1 | 68.2 | 36.5 | 4.7 | 27.0 |
| Pb | 4.95 | 34.6 | 56.4 | 12.7 | 67.3 | 1.8 | 73.8 | 47.6 | 21.5 | 4.7 |
| Ac | 5.31 | 39.0 | 59.3 | 18.7 | 69.5 | 8.5 | 75.6 | 51.2 | 26.8 | 2.4 |
| Th | 5.08 | 36.2 | 57.5 | 15.0 | 68.1 | 4.3 | 74.5 | 49.0 | 23.5 | 2.0 |
| | | | | BCC | | | | | | |
| Li | 3.49 | 7.2 | 38.1 | 23.8 | 53.6 | 39.2 | 62.9 | 25.7 | 11.4 | 48.5 |
| Na | 4.23 | 23.4 | 48.9 | 2.1 | 61.7 | 14.9 | 69.4 | 38.7 | 8.1 | 22.5 |
| K | 5.23 | 38.1 | 58.7 | 17.4 | 69.0 | 7.1 | 75.2 | 50.4 | 25.7 | 0.9 |
| V | 3.02 | 7.3 | 28.5 | 43.0 | 46.4 | 60.9 | 57.1 | 14.2 | 28.7 | 71.6 |
| Cr | 2.88 | 12.5 | 25.0 | 50.0 | 43.8 | 68.7 | 55.0 | 10.0 | 35.0 | 80.0 |
| Fe | 2.87 | 12.9 | 24.8 | 50.5 | 43.6 | 69.3 | 54.9 | 9.7 | 35.4 | 80.6 |
| Rb | 5.59 | 42.0 | 61.4 | 22.7 | 71.0 | 13.1 | 76.8 | 53.6 | 30.5 | 7.3 |
| Nb | 3.3 | 1.8 | 34.6 | 30.9 | 50.9 | 47.3 | 60.7 | 21.5 | 17.8 | 57.1 |
| Mo | 3.15 | 2.8 | 31.4 | 37.1 | 48.6 | 54.3 | 58.9 | 17.7 | 23.4 | 64.5 |
| Cs | 6.05 | 46.5 | 64.3 | 28.6 | 73.2 | 19.7 | 78.6 | 57.2 | 35.7 | 14.3 |
| Ba | 5.02 | 35.5 | 57.0 | 14.0 | 67.7 | 3.2 | 74.2 | 48.4 | 22.6 | 3.3 |
| Eu | 4.61 | 29.7 | 53.2 | 6.3 | 64.9 | 5.4 | 71.9 | 43.8 | 15.7 | 12.4 |
| Ta | 3.31 | 2.1 | 34.8 | 30.5 | 51.1 | 46.8 | 60.9 | 21.7 | 17.4 | 56.6 |
| W | 3.16 | 2.5 | 31.7 | 36.7 | 48.7 | 53.8 | 59.0 | 18.0 | 23.0 | 64.0 |

Nanoscale Devices

The present disclosure further relates to nanoscale devices, e.g. a nanoscale electrical device comprising one or more sources, one or more drains, one or more junctions comprising a semiconductor nanostructure for connecting at least one source and at least one drain. Possibly also one or more gates for gating at least one of said junctions. At least one of said junctions is formed by a nanostructure, such as a semiconductor nanostructure, such as a semiconductor nanowire.

Said semiconductor nanostructure may comprise one or more segments of a superconducting layer and one or more exposed segments of the semiconductor, e.g. to form a Josephson junction, e.g. a gateable Josephson junction. The nanostructure may be at least partly horizontally grown and/or grown parallel to a plane defined by the source(s) and/or the drain(s), as also explained herein. Hence, the nanostructure may extend in a plane which is parallel to but vertically suspended below or above a plane defined by the source(s) and/or the drain(s). Correspondingly said at least one gate may be vertically raised from and/or suspending the corresponding junction to become a gate which is proximal to said junction. Such nanoscale device can be manufactured according to the presently disclosed methods and thereby contain any of the features as disclosed herein.

The present disclosure further relates to a nanoscale device manufactured according to the herein disclosed methods. For example a nanoscale device comprising at least one exposed segment of the nanostructure and at least one segment which is covered by at least one deposited layer.

More specifically nanoscale electrical devices can be manufactured in wafer scale according to the method disclosed herein. The presently disclosed methods open for wafer scale in-situ production of nanoscale electrical devices, circuits, logical elements, etc. En electrical device may comprise one or more sources, one or more drains, one more junctions comprising a nanostructure for connecting at least one source and at least one drain, and one or more gates for gating at least one of said junctions.

A gate may for example be provided in the form of an electrostatic gate, e.g. a side gate or a top gate. A gate may be vertically raised from/suspending the corresponding junction to become a top gate proximal to said junction. An electrostatic side gate or top gate located adjacent to a junction, e.g. the weak link of a Josephson junction, such as a semiconductor weak link, can be configured to apply and control a voltage across the junction. In the case of a Josephson junction a tuneable Josephson junction is provided. The electrostatic gate may be configured to control the electron density in the junction by tuning the voltage of the electrostatic gate. In the case of a Josephson junction, an electrostatic gate may further be configured to control the Josephson energy through depletion in the semiconductor weak link by tuning the voltage of the electrostatic gate.

The junction may be formed by metal1-exposed nano-structure-metal2, wherein metal1 is a different material than metal2. The junction may comprise a tunnel barrier/Josephson junction of superconductor-exposed nanostructure-superconductor. Normal metal-exposed nanostructure-superconductor is another example of a tunnel barrier.

A nanoscale device may comprise one or more segments of superconducting islands wherein a superconducting island is formed by exposed nanostructure-superconductor—exposed nanostructure.

A nanoscale device may comprise a junction formed by metal-exposed nanostructure—short metal—exposed nano-structure—metal, wherein the length of the "short metal" segment is much smaller than the other metal segments.

More specifically for example a nanoscale device comprising an elongated device nanostructure having a gap in the surface layer formed by the presently disclosed method, this gap forming a tunnel barrier in the case of superconducting facet layer(s), i.e. a Josephson junction.

Hence, the present disclosure further relates to a Josephson junction manufactured in-situ according to the presently disclosed method, e.g. a Josephson junction comprising an elongated hybrid nanostructure comprising superconductor and semiconductor materials and a weak link, wherein the weak link is formed by an exposed semiconductor segment of the elongated hybrid nanostructure to provide a semiconductor weak link, i.e. equivalent to the semiconductor weak link being formed by a gap in the superconductor material provided by means of a shadow mask formed by an adjacent elongated nanostructure.

Different bridge geometries can be imagined for different device architectures to provide for a new in-situ manufacturing approach of known devices:

Using a single wide bridge, nanostructures half-covered, in for example metal, can be provided. These are similar to the structures produced by etching in Chang, et al, Nature Nanotechnology 10, 232 (2015). It should be noted that such nanostructures can also be the result of shadowing from the trench walls—i.e. without the need for bridges.

Narrow bridges can produce Metal-Nanowire-Metal junctions where the size of the exposed nanowire segment is determined by the width of the bridge. Such junction constitutes the conventional nanowire field-effect transistor. In the case of superconductors and shorts segments these structures realizes the gate-tunable nanowire Josephson junction with a hard gap, cf. T. Larsen, Physical Review Letters 115, 127001 (2015).

Double angle evaporation on a single bridge can provide Metal1-nanowire-Metal2 junctions. The size of the junction is determined by the width of the bridge and the angle of evaporation. For Metal1=Superconductor, Metal2=normal metal, these structures can provide canonical Majorana devices, cf. Mourik et al, Science 336, 1003 (2012) and Deng et al., Science 354, 1557-1562 (2016)

Two parallel bridges with a narrow gap can result in a nanostructure such as Metal-NW-(short) Metal-NW-Metal. For the case of superconductors, this structure is a Majorana island, cf. Albrecht et al., Nature 531, 206, 2016)

More than two parallel bridges, e.g. three, four, five or more parallel bridges, can also be provided. A Majorana qubit can for example be realized by means of three parallel bridges in order to provide two superconducting islands.

With appropriate adjustments of the layout of the shadow structure and nanowire growth positions, the presently disclosed is also compatible with nanowire crosses or T-shape junction which can be made by changing the growth direction by 90 deg at a certain height, making nanowires grow parallel to the substrate and join under the bridge.

EXAMPLE

FIGS. 1A-D show cut-through side views of one example of the presently disclosed approach of vertically displacing a platform from a substrate surface. In FIG. 1A a section of a substrate 1 of epi-ready InAs is shown, the substrate having a substrate surface 1'. In FIG. 1B a platform 2 of SiO has been defined on the substrate surface 1' using lithography. In FIG. 1C etching has been applied. The platform 2 is untouched by etching but the substrate surface 1' has been etched leaving the under-etched platform 2 which is vertically displaced from but parallel to the new substrate surface 1", parts 9 of the platform are suspending the substrate surface 1" leaving a void 4 below the suspended parts 9. FIG. 1D illustrates the deposition of a metal layer 3 on the platform 2 and the substrate surface 1". With the metal layer 3 deposited on top of the insulating SiO layer, i.e. the platform 2, and the platform 2 being suspended from the substrate surface 1", the metal layer 3 on the platform 3 is electrically disconnected from the substrate 1. FIG. 1E shows a SEM image of an example of an under-etched platform 2 providing a part of the platform 2 suspended from the substrate surface 1".

FIG. 2 shows top view (top) and corresponding cut-through side-view (below) of an example of a finished nanoscale device circuit layout. A platform 2 has been defined on a substrate surface 1', the platform defining the layout of an electrical device with source, gate and drain. Etching makes sure that the platform 2 is suspended from the substrate surface 1". A nanowire 7 grown below a suspended part 9 of the platform can provide for the gated connection between source and drain, as further explained in FIG. 3 below.

Figure 3E:
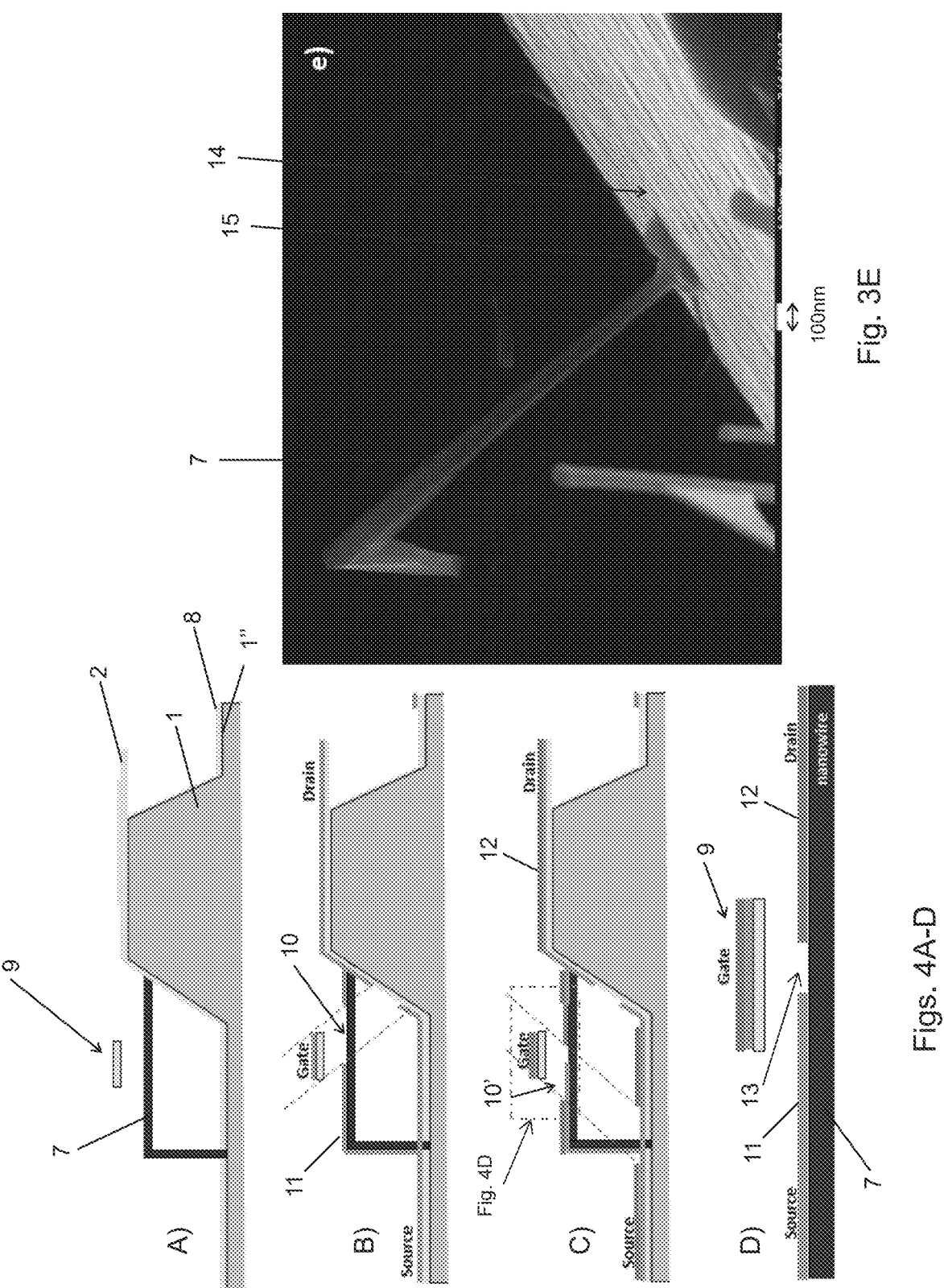

FIGS. 3A-E show cut-through side views of the provision of a nanowire 7 growing under a suspended part 9 of a platform 2. In FIG. 3A a section of a substrate 1 of epi-ready InAs is shown where a platform 2 of SiO has been defined on the substrate surface 1'. A resist etch mask 5 has been provided on the substrate surface 1' at least partly covering the SiO platform layout 2 to ensure that the etching creates the desired under-etched platform 2. In FIG. 3B etching has been applied to provide at least a part 9 of the platform 2 suspending the new substrate surface 1". In FIG. 3C a layer 8 of insulating SiO has been applied to the platform and the substrate surface 1" to ensure that there is no electrical connection between the platform and the substrate surface 1". A gold particle 6 has been applied to the substrate surface 1" in the vicinity of the suspended platform 9, the gold particle 6 becoming a nanowire catalyst defining an initial growth position of a nanowire 7. In FIG. 3D a nanowire 7 has been grown from the catalyst 6. Initially the growth direction is perpendicular from the substrate surface 1", but the growth direction has been kinked such that the nanowire grows under a suspended part 9 of the platform until it physically contacts and possibly merges/fuses with the under-etched structure in the form of a tilted facet 14 whereon the platform 2 rests, i.e. the supporting structure of the platform 2. The insert in FIG. 3E shows a close-up SEM image of a kinked nanowire 7 that has merged 15 with platform supporting structure tilted facet 14.

When a nanostructure grows under a suspended part of a platform and meets a supporting structure they will typically create some kind of physical contact. In order to create an electrical contact it is important that this physical contact is solid/unbroken. The two structures might grow together and merge with wit each other, possibly merge epitaxially if the crystal structure of the nanostructure match the crystal structure of the supporting structure. The physical contact might be in form of chemical bonding and/or bonding by means of the van der Walls principle. If the surface layer of the supporting structure is an electrically conductive layer, an electrical contact will be established when the semiconductor nanostructure contacts the supporting structure. If the surface layer of the supporting structure is an insulation layer such as an oxide layer, an electrical contact between the nanostructure and the supporting structure can be created by for example metal deposition as described elsewhere herein.

FIGS. 4A-D show cut-through side views of the provision of a gate 9 which is proximal over a nanowire junction. FIG. 4A substantially corresponds to FIG. 3D. In FIG. 4B a first layer 11 (e.g. normal metal or superconductor) has been deposited to function as drain, the deposition source (not shown) is located in the upper left direction in the figure as indicated by the deposition angle dotted lines. The deposited drain layer 11 covers the substrate surface 1", part of the nanowire 7 and the platform surface. However, the provision of the suspended part 9 of the platform 2 over the nanowire 7 creates a shadow mask 10 on the kinked part of the nanowire 7, such that some of the nanowire 7 is left exposed without the first drain layer 11. In FIG. 4C a second layer 12 (e.g. normal metal or superconductor) has been deposited to function as source, the deposition source (not shown) is located in the upper right direction in the figure as indicated by the deposition angle dotted lines. The second deposited source layer 12 covers the substrate surface 1", part of the nanowire 7 and the platform surface. However, the provision of the suspended part 9 of the platform 2 over the nanowire 7 creates another shadow mask on another part 10' of the kinked part of the nanowire 7. The result is that parts of the nanowire 7 is covered in both deposited layers 11, 12, however there will also be a first section of the nanowire 7 which is only covered by the first layer 11, a second section which is only covered by the second layer 12, and there between a section 13 of the nanowire which is left exposed, e.g. for electrostatic gating. I.e. a junction, such as a Josephson junction, formed by the source 11, drain 12 and exposed part 13 there between can be provided in this part of the nanowire device, as illustrated in FIG. 4D. Right above this junction of the nanowire a suspended part 9 of the platform is located, this suspended part 9 covered in both layers 11, 12, whereby a top gate 9 of the junction can be provided. All this can be provided in substantially concurrent process steps in situ under vacuum, i.e. substantially reducing the need for post-processing.

Whereas FIGS. 4A-D show the provision of an electrostatic gate over a nanowire junction provided on a nanowire grown by bottom-up growth, FIGS. 5A-D show the provision of an electrostatic gate over a nanostructure junction provided on a planar grown nanostructure, which has been defined by lithography below a "transparent" shadow structure. In FIG. 5A a planar nanowire has been grown below a shadow structure (a bridge) by means of diffusive growth. In FIG. 5B the nanowire is contacted by shadow evaporation, and remains unexposed in the segment shadowed by the bridge. The bridge then acts as a near-by metallic electrode in the geometry of a gate. If additional materials or shorter exposed nanowire segments are needed, subsequent angle evaporation can be performed as illustrated in FIG. 5C. The final functional device element is shown in FIG. 5D.

Figure 6A:
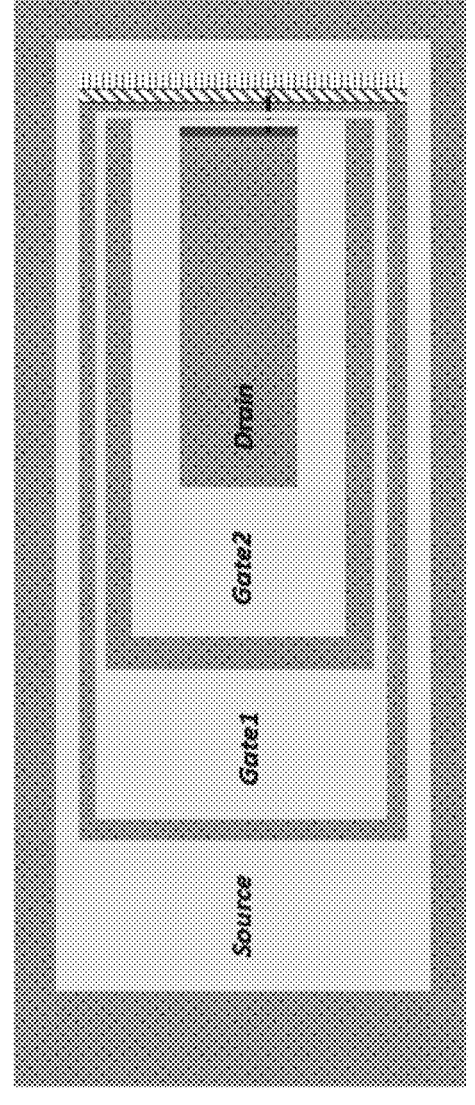
FIGS. 6A-B show top views of examples of finished nanoscale device circuit layouts. Platforms have been defined on a substrate surface, the platforms defining the layouts of electrical devices.
Figure 6B:
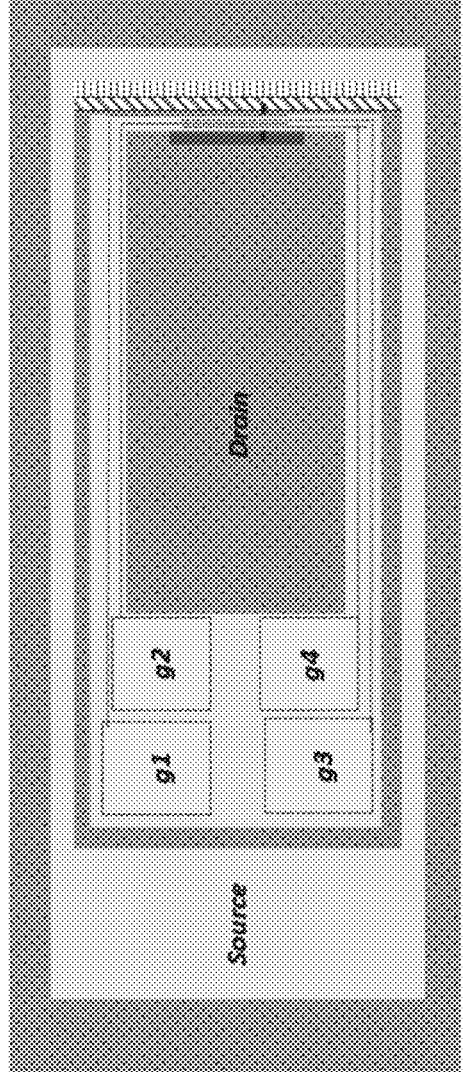

FIGS. 6A-B show top views of examples of finished nanoscale device circuit layouts. Platforms have been defined on a substrate surface, the platforms defining the layouts of electrical devices. In FIG. 6A the layout defines source, drain and two gates. A nanowire grown below a suspended part of the platform can provide for a junction for the gated connection between source and drain. The layout and the nanowire can be provided such that only one junction can control both gates. In FIG. 6B the layout defines source, drain and four gates g1-g4. The four gates g1-g4 are metal gates and have been prepared on the substrate below the SiO layer. To access the gates after growth of nanowires and deposited layers, an additional etching step is typically required.

FIG. 7A shows a top view of a finished nanoscale device circuit layout of a nanowire FET element that can be combined into a logical element. Circuit layouts are also exemplified in FIGS. 2 and 6. The layout in FIG. 7A comprises a source, a drain and two gates with separate nanowire based junctions provided as illustrated in FIG. 7A. Two of these FET elements can be combined into a logical-AND element as illustrated in FIGS. 7B-D, where FIG. 7B shows the logical-AND symbol, FIG. 7C illustrates how the FET elements can be connected to form the logical-AND and FIG. 7D shows the resulting output from the logical-AND element. The resistive elements used in FIG. 7C are not shown in FIG. 7A.

Figures 8A, 8B:
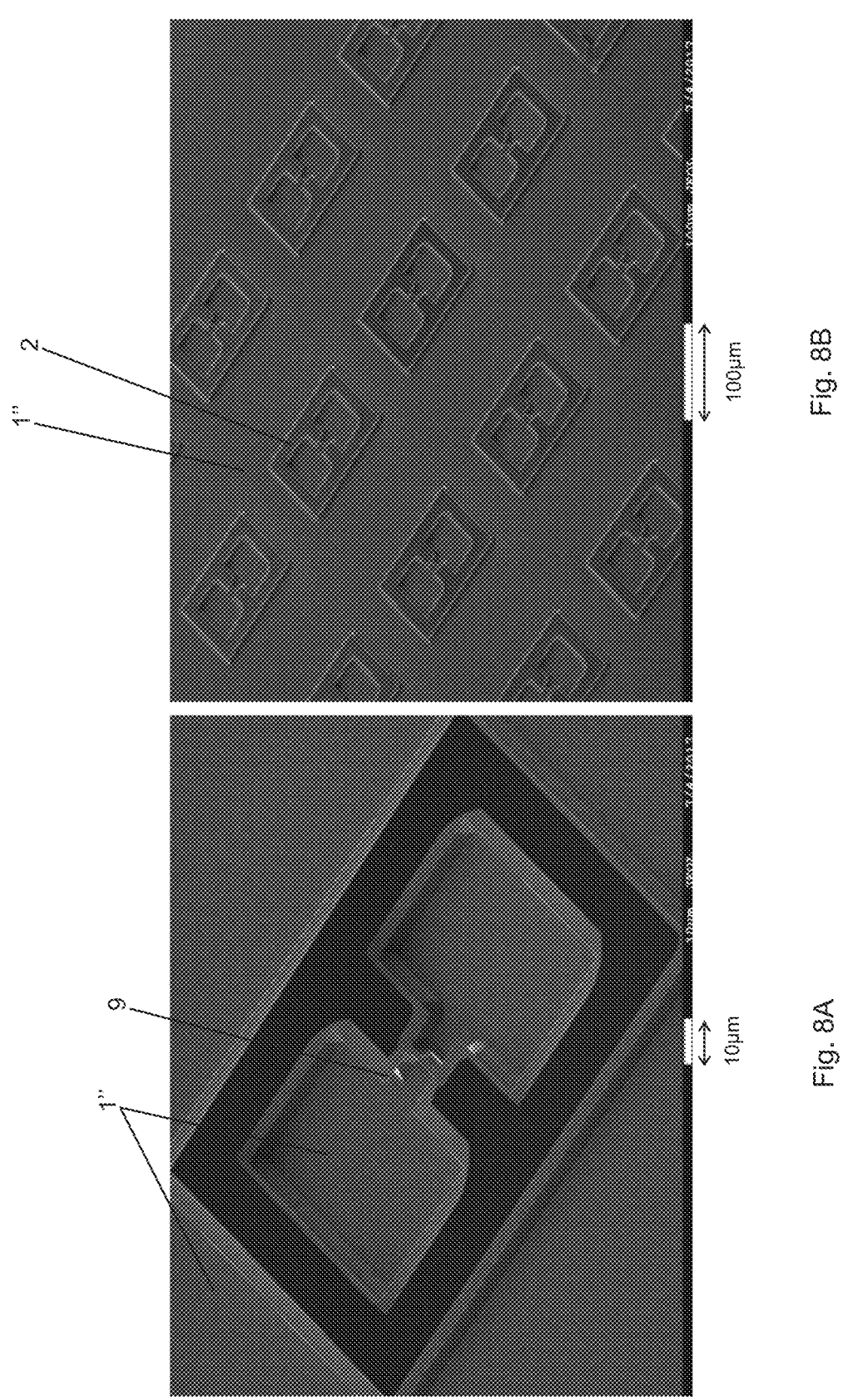
FIGS. 8A-B show platforms created according to the presently disclosed method.

FIGS. 8A-B show SEM images of platforms created according to the presently disclosed method. FIG. 8A shows a close-up of an under-etched platform 2 with a suspended part 9 vertically displaced from the substrate surface 9. The upper layer of the platform 2 is provided in an electrically conducting material that is electrically insulated from the substrate surface 1". FIG. 8B shows a plurality of these identical platforms 2 on a wafer demonstrating that the presently disclosed method provides a route to parallel processing of electrically insulated regions of electrically conducting material.

FIGS. 9A-B show top-view schematics of bridge(s) for defining Majorana islands. FIG. 9A shows the bridge structure (1) and the lithographically defined opening for planar growth (2). Lithography is performed through an electron/optically transparent bridge as described herein. The opening (2) can be directly below the bridge as shown, or off-set horizontally and then metal can be evaporated at an angle, i.e. FIG. 9A illustrates a top view of semiconductor and shadow structure just before the superconductor (metal) is deposited. FIG. 9B shows the resulting structure on the surface after growth of semiconductor and evaporation of superconductor through the bridge. The bridge is not shown, i.e. the shadow structure is disregarded in FIG. 9B. In this particular example the device has three potentially topologically islands half covered by superconductor (marked by dashed circles), and electrostatic side gates able to tune the electron occupation on the islands and the coupling between them.

FIGS. 9C-F show the process in FIGS. 9A-B from the side along the dotted line indicated in FIG. 9A. FIG. 9C shows shadow structure which is vertically raised from the substrate, which has a resist layer and a mask for planar growth on the surface. The resist layer is added as a polymer in solution and can therefore flow below the shadow structure.

FIG. 9D illustrates the application of lithography. The shadow structure does not form a shadow the lithography because it is made from a material and a configuration, e.g. thickness, which is transparent for electron and/or optical lithography, materials such as silicon oxide or silicon nitride.

FIG. 9E illustrates the development of the exposed area where the mask layer is etched to expose the substrate where the semiconductor can be grown.

FIG. 9F illustrates that, after the resist layer is removed, a semiconductor has been grown as a planar structure in the exposed area on the substrate by means of diffusive growth, i.e. the shadow structure does not block the growth, and a metal (superconductor) has been deposited by means of non-diffusive growth, i.e. the shadow structure forms a shadow mask on the semiconductor such that deposition of the superconductor can be controlled very precisely.

Figures 10A, 10B:
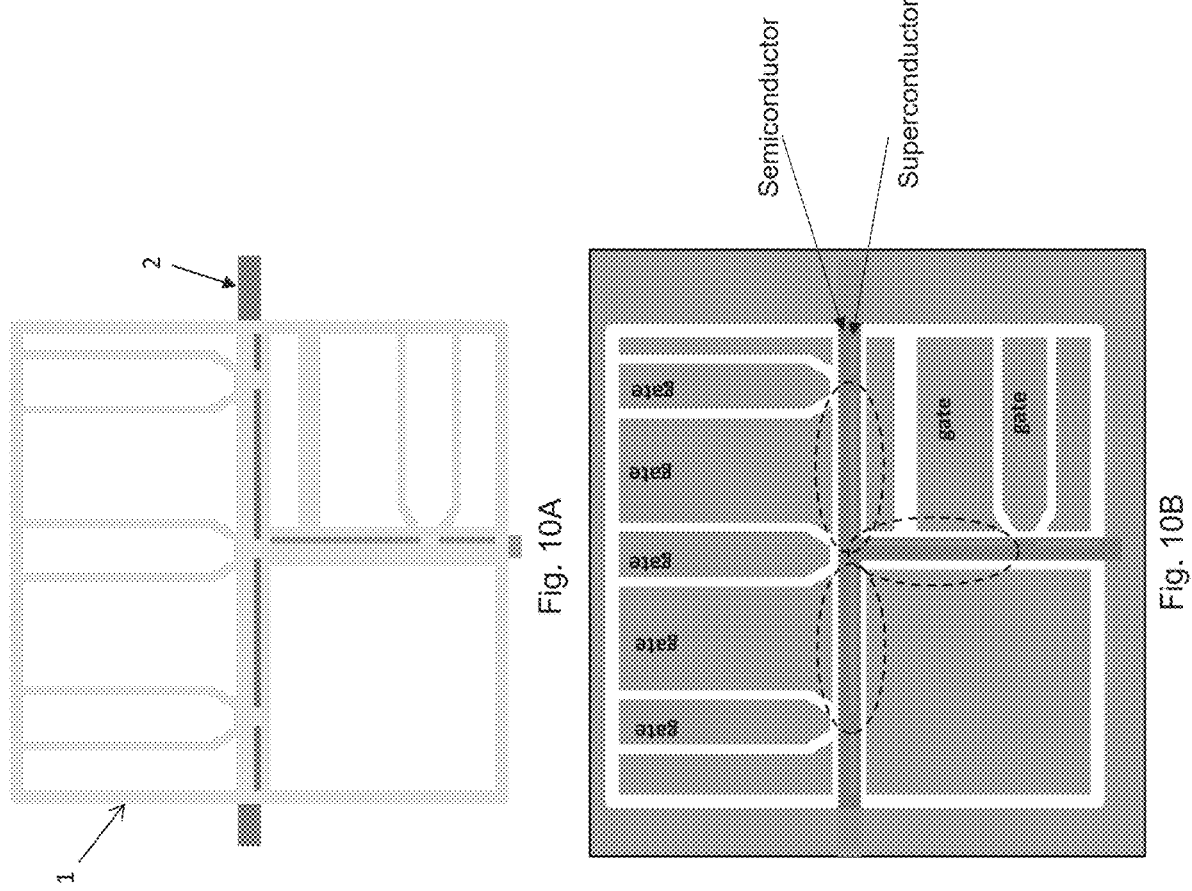
FIGS. 10A-B shows an example of a bridge structure for defining three islands sharing a single junction.

FIGS. 10A-B shows an example of a bridge structure for defining three islands sharing a single junction. FIG. 10A shows the bridge structure (1) and the lithographically defined opening for planar growth (2). Lithography is performed through an electron/optically transparent bridge as describe herein. FIG. 10B shows the resulting structure on the surface after growth of semiconductor and evaporation of superconductor through the bridge (the bridge is not shown). Such structures may be important for braiding operations in topological quantum information processing using bound states formed at the half-covered islands.

Figures 11A, 11B, 11C:
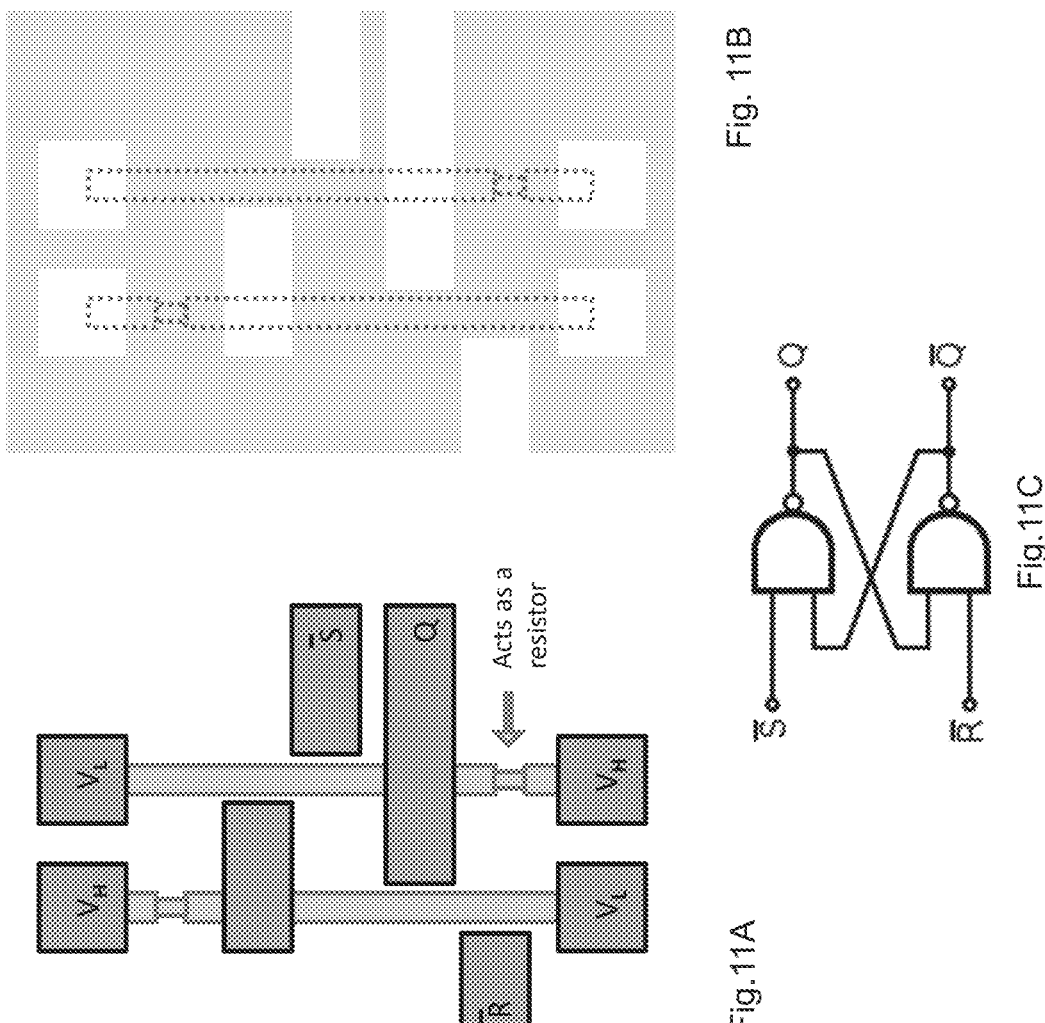
FIGS. 11A-C illustrates an example of how a bridge structure can define a classical logical circuit.

FIGS. 11A-C show an example of how a bridge structure can define a simple classical logical circuit. FIG. 11B shows the bridge design and FIG. 11A shows the logical circuit, which is the RS latch aka the RS-flip flop. This circuit acts as a basic memory cell—the output Q can be set or reset by pulsing S or R. Note these terminals are nominally high and pulses are to low values. After the pulses, the output will maintain its state. The low and high voltages ($V_L$ and $V_H$) are chosen below/above the threshold-voltage for pinch-off of the planar grown semiconductor nanowire. The constriction (arrow) acts as a point of high resistance, and thus defines the position of the voltage drop. Thus each nanowire with the two gates acts as a NAND gate: If any of the two gates are closed the output (e.g. Q) will have the value $V_H$. Only if they are both open, will the output have the potential $V_L$.

The examples in FIGS. 9-11 incorporate side-gates; the coupling from the gates can be enhanced by instead defining top-gates by angled deposition of metal and gate-oxides. Other classical logical circuits can be designed along the same lines.

Figures 12A, 12B, 12C, 12D, 12E:
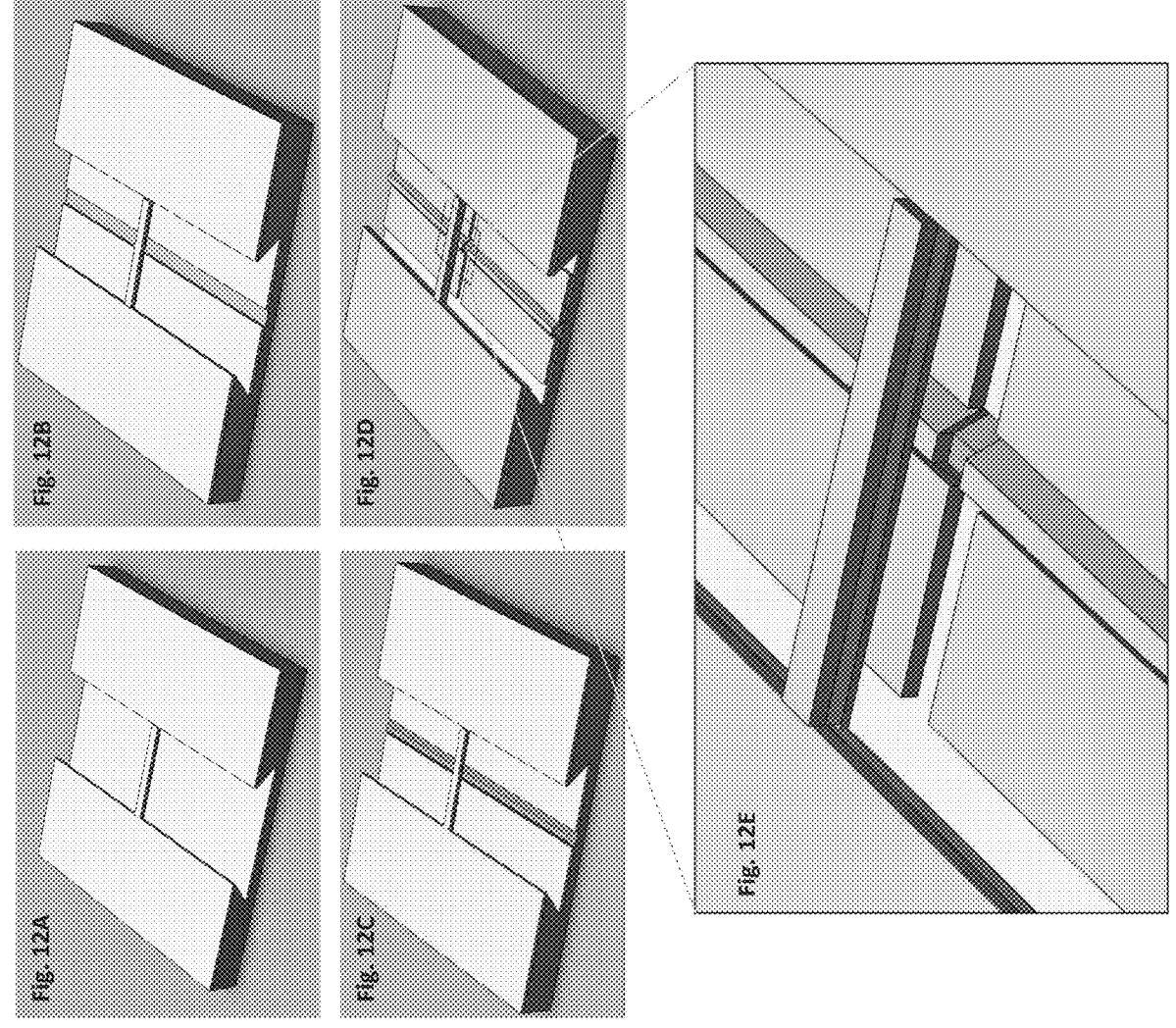
FIGS. 12A-E shows a schematic illustration of the use of electron and/or optically transparent material for the shadow structures.

FIGS. 12A-E shows a schematic illustration of the use of electron and/or optically transparent material for the shadow structures. A shadow structure is defined in FIG. 12A on a substrate consisting of a bridge over a trench. A thin layer of masking oxide has been deposited on the entire substrate. The semiconductor will not grow on this oxide layer but the shadow structure is transparent to conventional lithography. To define a planar nanostructure growth pattern conventional lithography and etching is used in to remove the masking oxide along a narrow region—including an area below the bridge of the shadow structure as shown in FIG. 12B. This opens up to the substrate, where semiconductor material can grow. In FIG. 12C a planar semiconductor nanostructure is grown but only in the exposed area defined by the growth pattern. The growth relies on diffusion on the substrate and is not affected by the presence of the shadow structure. In FIG. 12D a metal layer is deposited vertically at low temperature. Here diffusion is negligible, i.e. non-diffusive deposition, and the shadow structure defines a gap in the superconductor as emphasized in the zoom shown in panel in FIG. 12E.

Figure 13:
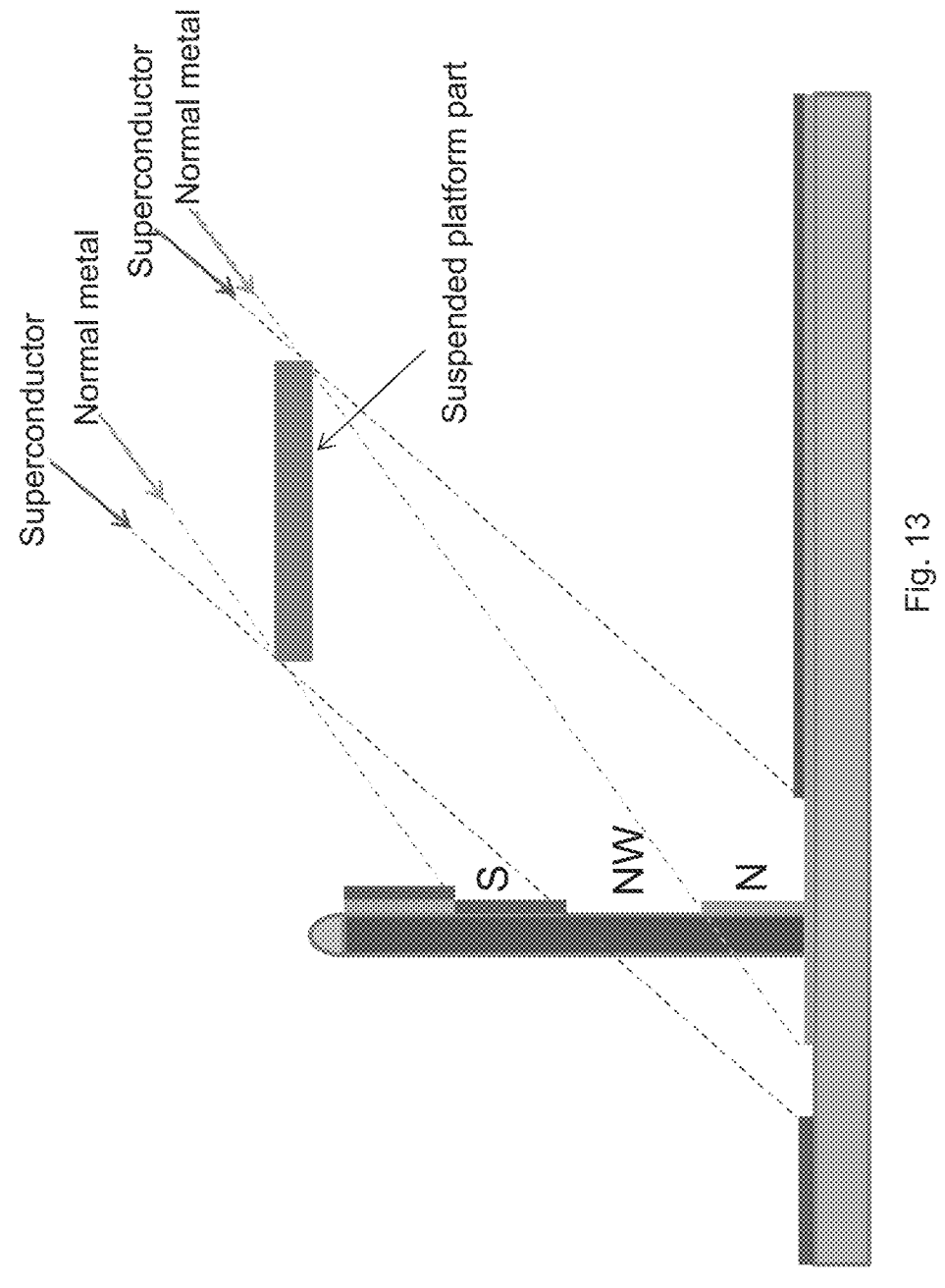
FIG. 13 shows a cross-sectional view of one example a suspended part of a platform creating a shadow structure on a vertical nanowire.

FIG. 13 shows a cross-sectional view of one example a suspended part of a platform creating a shadow structure on a vertical part of a nanowire (NW). A nanowire has been grown from the substrate surface by bottom-up growth in the vicinity of a suspended part of a platform. The arrows indicate deposition angles of a layer of superconductor and a layer of normal metal and illustrate how a S-NW-N junction can be created by having different angles of deposition relative to the platform shadow structure.

FIGS. 14A-C illustrate a confirmation of the existence of a hard induced gap in hybrid nanostructures fabricated using an approach similar to the presently disclosed approach.

FIG. 14A shows an image of the device: A half-shell facet layer of superconducting Tantalum was grown on an InAs nanowire. A shadow structure provided a gap in the Tantalum layer allowing contacting of the semiconductor. FIG. 14B shows a schematic of the device where two side-gates are used to locally deplete the semiconductor and allow for a tunnel measurement of the density of states of the hybrid semiconductor/superconductor nanostructure. FIG. 13C shows the tunnel conductance as a function of applied bias on normal (top) and log scale (bottom), respectively. As seen from the graphs, the hard gap is clearly visible at low temperature, i.e. below 20 mK.

Figures 15A, 15B, 15C:
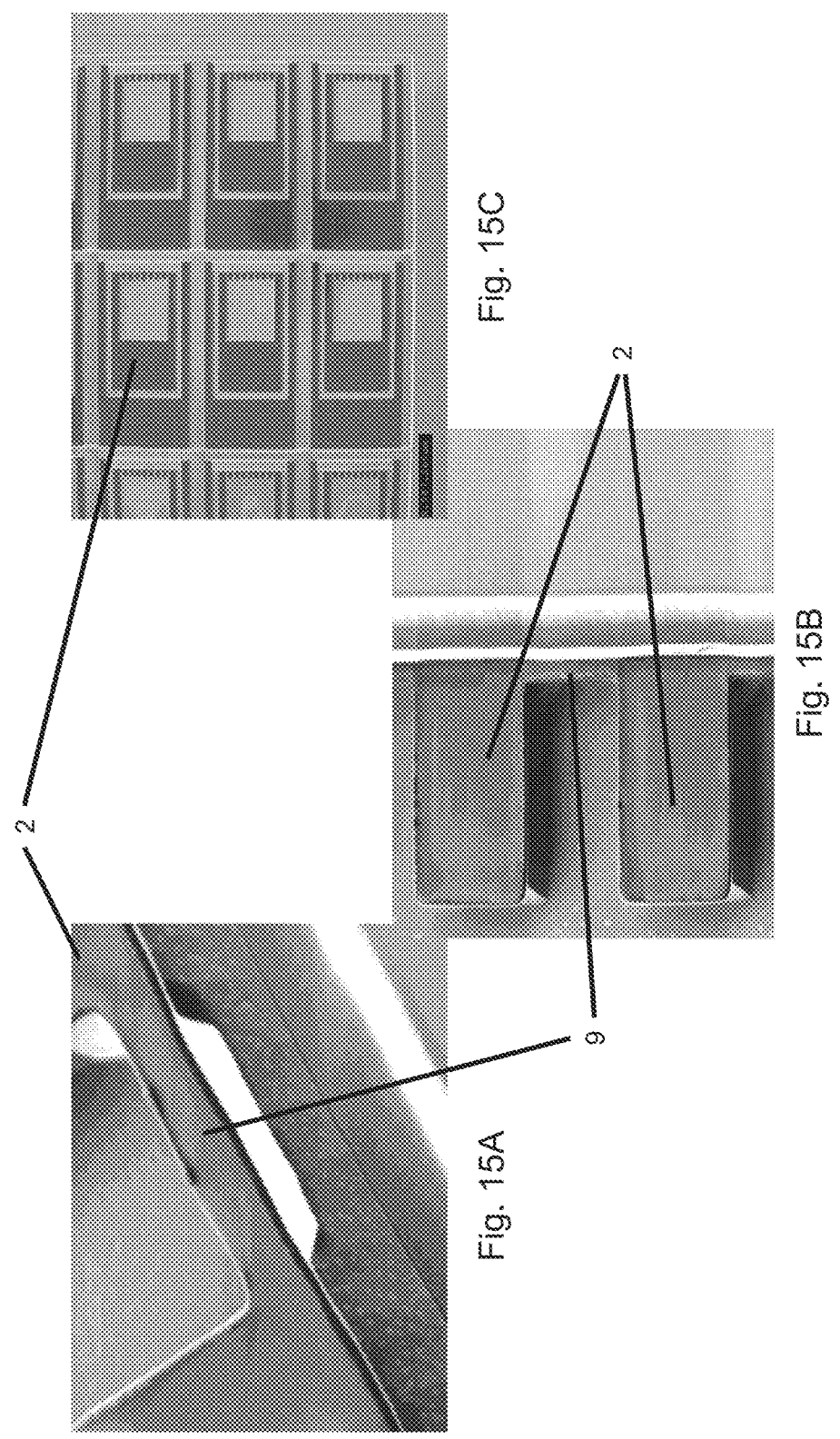
FIGS. 15A-C show SEM images of platforms created according to the presently disclosed method.

FIGS. 15A-C show SEM images of platforms created according to the presently disclosed method. FIG. 15A shows a close-up of an under-etched platform 2 with a suspended part 9 vertically displaced from the substrate surface. The upper layer of the platform 2 is provided in an electrically conducting material that is electrically insulated from the substrate surface. FIG. 15B shows that the platform consists of a plurality of suspended parts, vertically displaced from the substrate surface. The suspended parts of the platform being separated by parts of the platform which are in contact with support structures of the substrate.

Figures 16A, 16B, 16C:
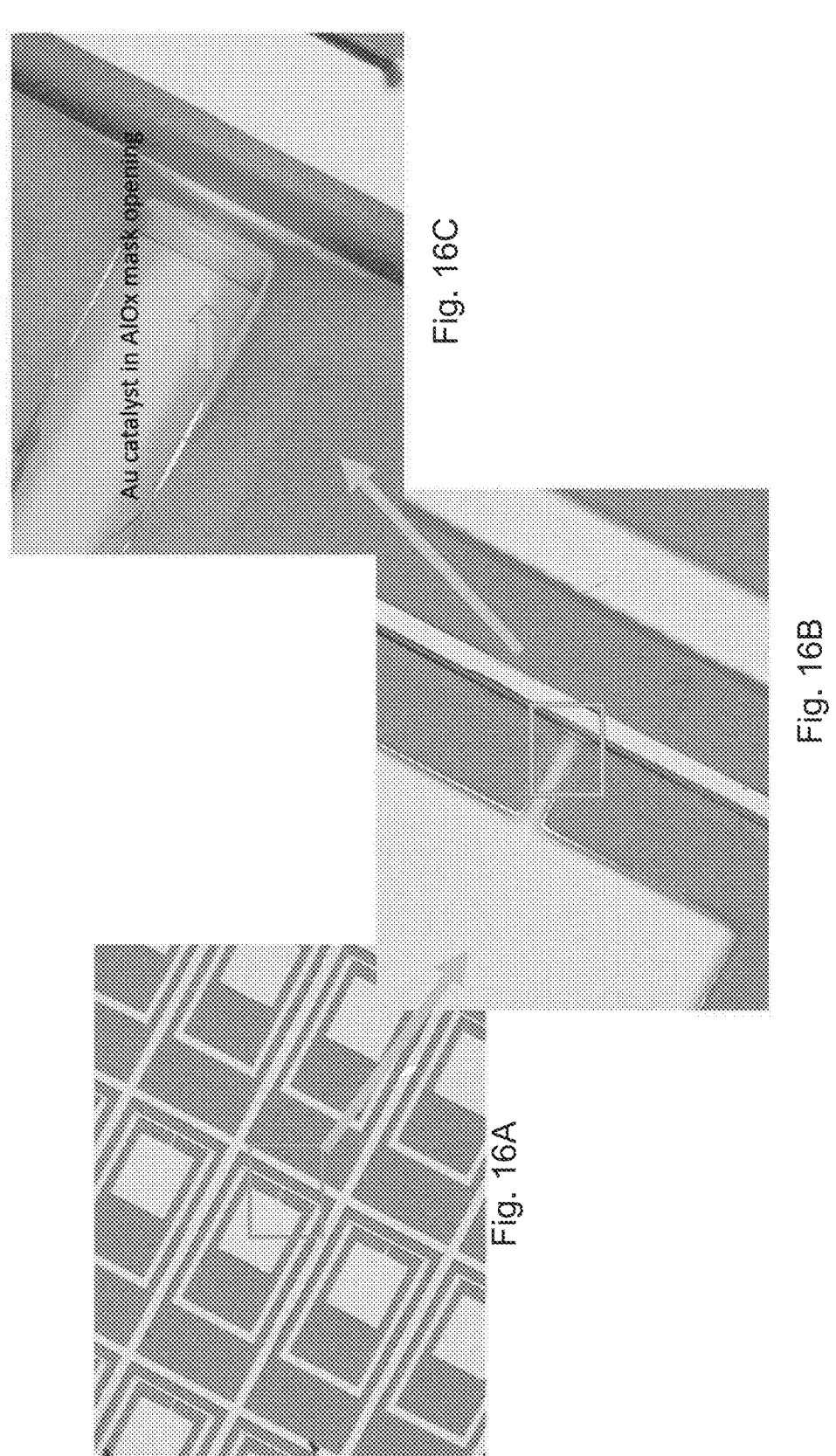
FIGS. 16A-C show SEM images of platforms created according to the presently disclosed method.

FIGS. 16A-C show SEM images of platforms created according to the presently disclosed method. As can be seen in FIG. 16A, multiple platforms can be positioned next to each other, enabling parallelization for scaling up the processing and fabrication of nanostructure electrical devices. FIG. 16B shows a magnified view wherein the upper layer of a platform can be seen to contain a suspended part. FIG. 16C shows an even further magnified view of the platform, wherein an Au catalyst particle can be seen in the aluminium oxide mask opening.

Figures 17A, 17B, 17C, 17D:
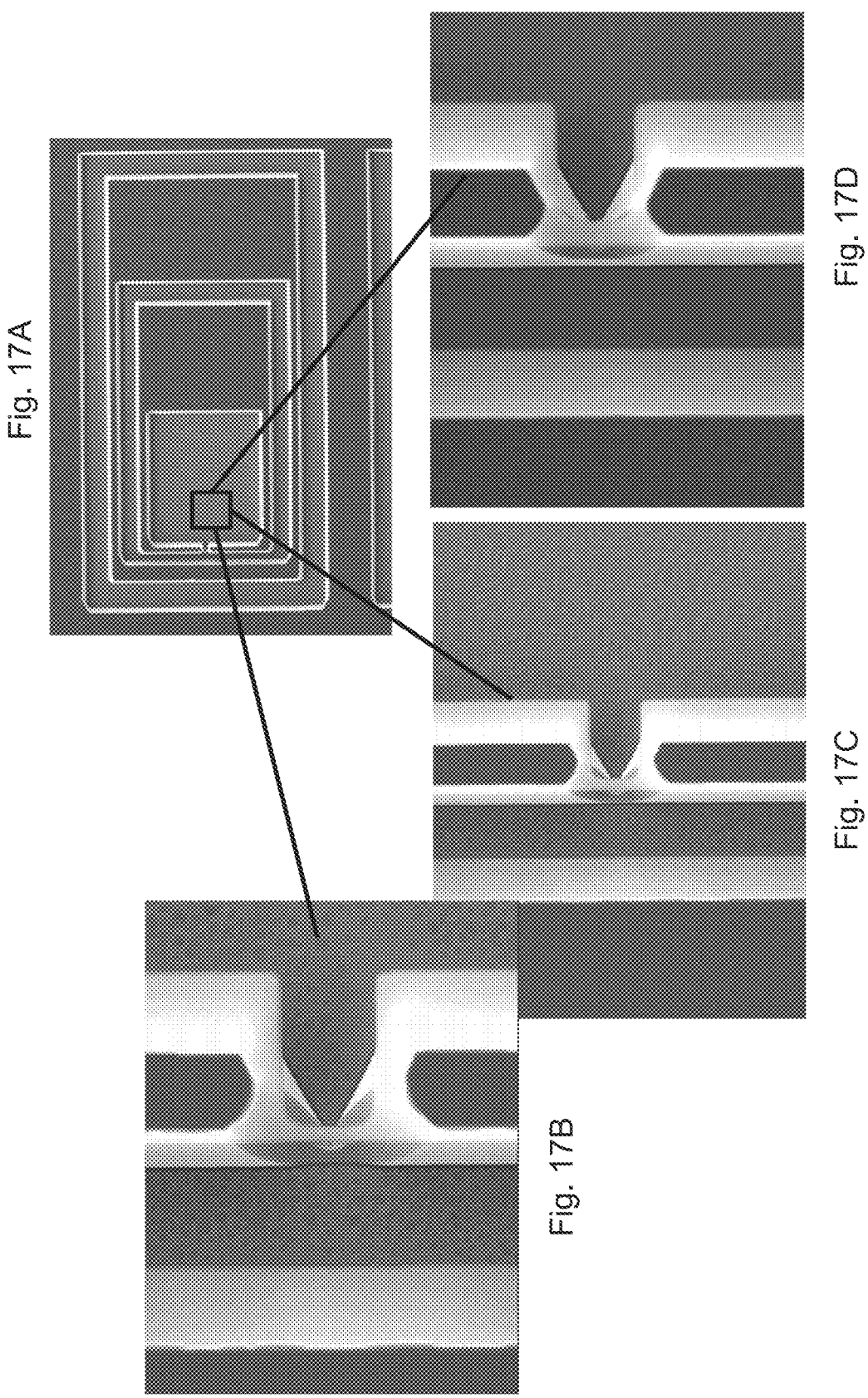
FIGS. 17A-D show SEM images of platforms created according to the presently disclosed method.

FIGS. 17A-D show SEM images of platforms created according to the presently disclosed method. FIG. 17B-D show size variations in the suspended part of the platform given in FIG. 17A. The size variations may be induced by modifying the processing parameters, as discussed elsewhere in this document.

The horizontal white structures in the bottom of FIGS. 1E, 4E, 8A and 8B indicate the dimensions in the corresponding SEM images.

Items

The invention will now be described in further details with reference to the numbers items below.

1. A method for manufacturing a substrate for growth of crystalline nanostructures, the method comprising the steps of:
   depositing one or more layers of a crystal growth compatible dielectric material, such as silicon oxide, in a predefined pattern on the surface of a crystal growth compatible substrate to create a predefined etch pattern of said crystal growth compatible material, and
   selectively etching the substrate surface around said etch pattern to provide at least one under-etched platform which is vertically raised from the etched substrate surface.
2. The method according to item 1, comprising the step of depositing at least one electrically conducting layer on top of the platform, (such that the electrically conducting layer is electrically isolated from the substrate surface).
3. The method according to any of the preceding items, further comprising the step of masking at least part of the predefined pattern and/or at least a part of the substrate surface in resist prior to the step of selective etching.
4. The method according to any of the preceding items, wherein the predefined pattern comprises layout for at least one source and/or at least one drain for at least one nanoscale device.
5. The method according to any of the preceding items, further comprising the step of depositing at least one layer of a crystal growth compatible dielectric material, such as silicon oxide, subsequent to the step of selective etching, to ensure electric isolation of the under-etched platform.
6. The method according to any of the preceding items, wherein said at least one under-etched platform is provided in a material and a configuration which is transparent to optical lithography and/or electron beam lithography, such as silicon oxide and/or silicon nitride.
7. The method according to any of the preceding items, comprising the step of defining a nanostructure pattern for defining a growth pattern for one or more planar (crystalline) nanostructures.
8. The method according to item 7, wherein at least one of said planar nanostructure growth patterns is located below at least one under-etched platform.
9. A method for provision of a nanoscale device, the method comprising the steps of
   providing a growth substrate having a substrate surface and at least one platform which is parallel to but vertically raised from the substrate surface, and
      growing, by means of diffusive growth, at least one planar nanostructure in a planar growth pattern on the substrate surface, such that at least one planar nanostructure extends below at least one vertically raised platform and/or
      growing, by means of bottom-up growth, at least one elongated nanostructure from the substrate surface in the vicinity of at least one of said platforms, and
      controlling the growth direction such that at least one of said nanostructures grows under a part of one of said platforms.
10. The method according to item 9, comprising the step of controlling the growth of said elongated nanostructures such that at least one of the elongated nanostructures growing under a part of a platform, merges with a structure supporting the platform, and/or physically contacts a structure supporting the platform, or a layer covering said structure supporting the platform.
11. The method according to any of preceding items 9-10, comprising the step of depositing, preferably by means of non-diffusive growth, at least a first layer of material on the platform and on at least a part of the nanostructure(s) by means of at least a first deposition source, wherein the deposition source, the platform(s) and the nanostructure(s) are arranged such that, during deposition of said first layer(s), at least a part of the platform(s) forms at least one shadow mask on the nanostructure(s) relative to the deposition source.
12. The method according to any of preceding items 9-11, comprising the step of depositing, preferably by means of non-diffusive growth, at least a second layer of material on at least a part of the nanostructure(s) by means of at least a second deposition source, wherein the second deposition source, the platform(s) and the nanostructure(s) are arranged such that, during deposition of said second layer(s), at least a part of the platform(s) forms at least one shadow mask on the nanostructure(s) relative to the deposition source.

13. The method according to any of preceding items 11-12, wherein the first layer and/or the second layer is a conducting material, such as metal, and wherein at least one platform and at least one nanostructure is arranged such that the part of said platform suspended above said nanostructures becomes a gate proximal to the nanostructure.

14. The method according to any of preceding items 11-13, wherein the material of the second layer is different from the material of the first layer.

15. The method according to any of preceding items 11-14, wherein the first layer and/or the second layer is selected from the group of semiconductors, superconductors, metals, magnetic materials, oxides and dielectrics.

16. The method according to any of preceding items 11-15, wherein the platform comprises a layout for at least one source and/or at least one drain for at least one nanoscale device and such that the first layer and/or the second layer adds to this layout to form said least one source and/or said at least one drain.

17. The method according to any of preceding items 9-16, wherein the elongated nanostructures are substantially one-dimensional nanostructures, and/or elongated crystalline nanostructures.

18. The method according to any of preceding items 9-17, wherein the elongated nanostructures are provided by bottom-up growth and selected from the group of nanowires (crystals) or nanowhiskers (crystal) or nanorods (crystals).

19. The method according to any of preceding items 9-18, wherein the elongated nanostructures comprise a plurality of substantially plane side facets.

20. The method according to any of preceding items 9-19, wherein the growth positions of elongated nanostructures on the substrate are determined by means of one or more catalyst patterns, such as defined on the surface of the substrate, preferably by means of lithography.

21. The method according to any of preceding items 9-20, wherein the growth positions of elongated nanostructures on the substrate are substantially randomly determined.

22. The method according to any of preceding items 9-21, wherein the growth direction of the elongated nanostructures can be controlled by kinking the growth direction of at least a part of the nanostructure(s) during growth of said nanostructure(s).

23. The method according to any of preceding items 9-22, wherein the planar nanostructure(s) are planar structures provided by diffusive growth in a plane substantially parallel to the substrate surface.

24. The method according to any of preceding items 9-23, wherein at least a part of the method are performed under vacuum, preferably ultra high vacuum, for example in one or more vacuum chambers, and wherein the steps of growing at least one nanostructure and depositing the first layer and optionally the second layer are performed without breaking the vacuum.

25. The method according to any of preceding items 9-24, wherein the first and/or second deposition source is a vapor deposition source, and wherein the vacuum chamber and the deposition source(s) are configured to provide a directional beam flux from the deposition source(s) during deposition.

26. The method according to any of preceding items 9-25, wherein the deposited layer(s) is a metal and/or a material that becomes superconducting below a critical temperature, such as a metal selected from the group of Al, Ca, Ni, Cu, Kr, Sr, Rh, Pd, Ag, Ce, Yb, Ir, Pt, Au, Pb, Ac, Th, Li, Na, K, V, Cr, Fe, Rb, Nb, Mo, Cs, Ba, Eu, Ta and W or a superconductor selected from the group of high temperature ceramic superconductors, such as copper oxide and cuprate superconductors, or a superconductor selected from the group of superconducting alloys, such as NbN, NbTiN, NiGe, NbSn and $MgB_2$.

27. The method according to any of preceding items 9-26, wherein the nanostructure is provided in a semiconducting material, such as a semiconducting material selected from the group of III-V combinations, such as InAs, InP, InSb, GaAs, GaSb, AlSb and InGaAs, or group IV elements such as Si or Ge, or II-VI combinations such as ZnO, ZnSe and CdSe, or I-VII combinations.

28. The method according to any of preceding items 9-27, comprising the step of covering substantial the entirety of said at least one nanostructure with at least one final layer, a final layer such as an oxide coating.

29. The method according to any of preceding items 9-28, wherein the substrate is provided according to the method of any of items 1-8

30. A nanoscale electrical device comprising one or more sources, one or more drains, one or more junctions comprising a semiconductor nanostructure for connecting at least one source and at least one drain, and one or more gates for gating at least one of said junctions, and wherein at least one of said junctions is formed by a semiconductor nanowire.

31. The nanoscale device according to item 30, wherein said semiconductor nanowire comprises one or more segments of a superconducting layer and one or more exposed segments of the semiconductor.

32. The nanoscale device according to any of item 30-31, wherein said nanowire is at least partly horizontally grown and/or grown parallel to a plane defined by the source(s) and/or the drain(s).

33. The nanoscale device according to any of items 30-32, wherein said semiconductor nanowire extends in a plane which is parallel to but vertically suspended below or above a plane defined by the source(s) and/or the drain(s).

34. The nanoscale device according to any of items 30-33, wherein said at least one gate is vertically raised from and/or suspending the corresponding junction to become a gate which is proximal to said junction.

35. The nanoscale device according to any of items 30-34, manufactured according to the method of any of items 9-29.

36. A nanoscale device manufactured according to any of items 9-29.

37. A nanoscale device manufactured according to any of items 9-29, comprising an at least one exposed segment of the nanostructure and at least one segment which is covered by at least one deposited layer.

38. A nanoscale electrical device manufactured according to any of items 1-29, comprising one or more sources, one or more drains, one more junctions comprising a nanostructure for connecting at least one source and at least one drain, and one or more gates for gating at least one of said junctions.

39. The nanoscale electrical device according to item 38, wherein the junction is formed by metal1-exposed nanostructure-metal2, wherein metal1 is a different material than metal2.

40. The nanoscale electrical device according to any of items 38-39, wherein the junction comprises a tunnel barrier/Josephson junction of superconductor-exposed nanostructure-superconductor.

41. The nanoscale electrical device according to any of items 38-40, wherein said at least one gate is vertically raised from/suspending the corresponding junction to become a gate which is proximal to said junction.

42. A nanoscale device manufactured according to any of items 1-29, comprising one or more segments of super-conducting islands wherein a superconducting island is formed by exposed nanostructure—superconductor—exposed nanostructure.

43. A nanoscale device manufactured according to any of items 1-29, wherein a junction is formed by metal-exposed nanostructure—short metal—exposed nano-structure—metal, wherein the length of the "short metal" segment is much smaller than the other metal segments.

44. A nanoscale device manufactured according to any of items 1-29, wherein a junction is formed by metal-exposed nanostructure—metal—exposed nanostruc-ture—metal.

The invention claimed is:

1. A method for manufacturing a substrate for epitaxial growth of crystalline nanostructures, the method comprising the steps of:

depositing one or more layers of an epitaxial growth condition compatible dielectric material in a predefined pattern on an unetched surface of an epitaxial growth compatible substrate to create a predefined etch pattern of said epitaxial growth condition compatible dielectric material, the epitaxial growth condition compatible dielectric material being distinct from the epitaxial growth compatible substrate;

selectively etching a region of the unetched surface around said etch pattern, thereby creating a space between the epitaxial growth condition compatible dielectric material and an etched surface of the region, so as to provide at least one under-etched platform comprising the one or more layers of the epitaxial growth condition compatible dielectric material that is vertically raised from the etched surface; and depositing at least one electrically conducting layer on top of the platform such that the electrically conducting layer is electrically isolated from the etched surface, wherein a vertical offset between the unetched surface and the etched surface is at least 100 nm.

2. The method according to claim 1, further comprising the step of masking at least part of the predefined pattern and/or at least a part of the substrate surface in resist prior to the step of selective etching, and further comprising the step of depositing at least one layer of an epitaxial growth condition compatible dielectric material subsequent to the step of selective etching, to ensure electric isolation of the under-etched platform.

3. The method according to claim 1, wherein the pre-defined pattern comprises layout for at least one source and/or at least one drain for at least one nanoscale device.

4. The method according to claim 1, wherein said at least one under-etched platform is provided in a material and a configuration which is transparent to light of wavelengths for optical lithography and/or electrons of energy for elec-tron beam lithography.

5. The method according to claim 1, comprising the step of defining a nanostructure pattern for defining a growth pattern for one or more planar crystalline nanostructures, wherein at least one of said nanostructure growth patterns is defined below at least one under-etched platform.

6. The method according to claim 1, wherein the epitaxial growth condition compatible dielectric material is silicon oxide.

7. The method according to claim 4, wherein said at least one under-etched platform is provided in silicon oxide or silicon nitride, at a thickness below 200 nm.

* * * * *